(12) United States Patent
Hashi et al.

(10) Patent No.: US 6,850,377 B2
(45) Date of Patent: Feb. 1, 2005

(54) MASTER INFORMATION CARRIER/ MAGNETIC RECORDING MEDIUM DEFECT INSPECTION METHOD

(75) Inventors: Hideyuki Hashi, Osaka (JP); Taizou Hamada, Osaka (JP); Tatsuaki Ishida, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 324 days.

(21) Appl. No.: 10/123,417

(22) Filed: Apr. 17, 2002

(65) Prior Publication Data
US 2002/0159174 A1 Oct. 31, 2002

(30) Foreign Application Priority Data

Apr. 25, 2001 (JP) .................................... P2001-127677
Jun. 15, 2001 (JP) .................................... P2001-181427

(51) Int. Cl.$^7$ .............................................. G11B 5/86
(52) U.S. Cl. ............................ 360/17; 360/15; 360/16
(58) Field of Search ............................. 360/15, 16, 17, 360/53, 31

(56) References Cited

U.S. PATENT DOCUMENTS 6,665,133 B1 * 12/2003 Hashi et al. .................. 360/17

FOREIGN PATENT DOCUMENTS

| JP | 62-110139 | 5/1987 |
|----|-----------|--------|
| JP | 62-198776 | 9/1987 |
| JP | 10-40544 | 2/1998 |
| JP | 2001-167434 A | 6/2001 |
| JP | 2001-176001 A | 6/2001 |

* cited by examiner

Primary Examiner—Sinh Tran
Assistant Examiner—Daniell L. Negrón
(74) Attorney, Agent, or Firm—McDermott Will & Emery LLP

(57) ABSTRACT

Instead of directly performing defect inspection using a master information carrier, an inspection substrate is prepared to then bring the master information carrier in close contact therewith, to thereby transfer a defect on the master information carrier to the inspection substrate, thus indirectly inspecting any defect of the master information carrier on the inspection substrate. Defect inspection is performed on the first-state inspection substrate before close contacting, so that a defect inspection result on the second-state inspection substrate after close contacting and that on the first-state inspection substrate are compared to each other.

27 Claims, 31 Drawing Sheets

FIG. 18

| ΔR(μm) | Δθ (°) | Defect type | Step ST1 | | Step ST4 | |
|---|---|---|---|---|---|---|
| | | | R(μm) | θ (°) | | θ (°) |
| 10 | 4.125 | Recess | 36880 | 232.75 | 36870 | 236.875 |
| 20 | 4.25 | Recess | 39250 | 15.5 | 39230 | 19.75 |
| 10 | 4.125 | Recess | 44310 | 203.25 | 44300 | 207.375 |
| 10 | 4.125 | Recess | 46130 | 125.25 | 46120 | 129.375 |

FIG. 29

| ΔR(μm) | Δθ(°) | Defect type | Step 2 | | Step 4 | |
|---|---|---|---|---|---|---|
| | | | R(μm) | θ(°) | R(μm) | θ(°) |
| −20 | −8.625 | Recess | 28030 | 116.375 | 28050 | 107.75 |
| 0 | −8.5 | Recess | 32450 | 123.25 | 32450 | 114.75 |
| 0 | −8.625 | Recess | 33750 | 9.125 | 33750 | 0.5 |
| 0 | −8.5 | Recess | 34630 | 65.25 | 34630 | 56.75 |
| 0 | −8.5 | Recess | 38970 | 10.75 | 38970 | 2.25 |
| 0 | −8.625 | Recess | 39420 | 44.625 | 39420 | 36 |
| 10 | −8.5 | Recess | 43260 | 343.5 | 43250 | 335 |
| 0 | −8.5 | Recess | 44380 | 348.625 | 44380 | 340.125 |
| 0 | −8.625 | Recess | 44850 | 36.375 | 44850 | 27.75 |

MASTER INFORMATION CARRIER/MAGNETIC RECORDING MEDIUM DEFECT INSPECTION METHOD

BACKGROUND OF THE INVENTION

1. Field of the Invention

The invention relates to a defect inspection method for a magnetic recording medium used in a hard disk apparatus or a floppy disk apparatus and a defect inspection method for a master information carrier used for magnetically transferring an information signal to a magnetic recording medium. The invention also relates to a magnetic film pattern magnetic transfer method by use of a master information carrier, and more particularly to a magnetic recording/reproduction apparatus.

2. Description of the Related Art

A magnetic recording medium mounted to a magnetic recording/reproduction apparatus such as a hard disk drive apparatus records thereon an information signal used for a servo mechanism for a recording/reproduction head. This information signal may be a tracking servo signal, an address information signal, a reproduction clock signal or the like. With a recent increase in the track density, the capacity of information signals that can be recorded by a servo writer may not be increased any more. To solve this problem, there is suggested such a system that a so-called master information carrier is prepared to thereby transfer and record an information signal thereon to a magnetic recording medium. The master information carrier is formed of a magnetic portion made of a ferromagnetic material on a non-magnetic base surface in such a pattern shape as to correspond to an information signal. The master information carrier is brought in contact with the surface of the magnetic recording medium on which a ferromagnetic thin film or a ferromagnetic powder-applied layer is formed and then has an external magnetic field applied thereon, to thereby transfer and record to the magnetic recording medium a magnetized pattern having such a pattern shape as to correspond to the information signal on the master information carrier.

In this case, it is necessary to record the information signal to the magnetic recording medium uniformly and in a stable manner. If the master information carrier has an abnormal protrusion or foreign matter on its surface, however, a pit may occur in the surface of the magnetic recording medium when it comes in close contact with the master information carrier.

FIGS. 31A and 31B show a surface a of the magnetic recording medium after magnetic transfer by use of a master information carrier which has an abnormal protrusion or foreign matter. A reference symbol b indicates a pit and a reference symbol c indicates a minute protrusion generated in reaction to the formation of the pit. FIG. 31A shows a picture, while FIG. 31B shows implicitly the position and the size of the surface a, the pit b, and the minute protrusion c in correspondence with the unclear picture. FIG. 32 shows a cross section of the pit as measured. As shown in FIG. 32, surrounding the pit b indented by approximately 50 nm from the surface of the magnetic recording medium is present a minute protrusion c with a height of approximately 20 nm. Typically, a float amount of the head slider with respect to the surface of the magnetic recording medium is approximately 20 nm. If there is a minute protrusion of approximately 20 nm on the magnetic recording medium, therefore, the magnetic head may possibly come in contact with the magnetic recording medium. Immediately after they com in contact with each other, the magnetic head is hit and has a larger clearance with respect to the magnetic recording medium, thus deteriorating the recording/reproduction performance of the signal. In addition, if the magnetic head physically comes in contact with the magnetic recording medium, the magnetic head may suffer from a shortened service life and the magnetic recording medium may be damaged.

FIG. 33 shows a result of optical measurement of a state of a protrusion on the surface of a magnetic recording medium after magnetic transfer in a case where there is an abnormal protrusion or foreign matter on the surface of a master information carrier during the magnetic transfer. It shows the presence of the protrusion as large as a 20 nm or more. The protrusion affects the recording/reproduction performance and the service life of the magnetic head the more as the float amount of the magnetic head becomes smaller due to an increasing recording density. To guard against this, it is necessary to inspect a defect on the surface of the master information carrier. It is, however, difficult to inspect an abnormal protrusion or foreign matter present on the master information carrier because of the presence of a pattern shape corresponding to the information signal. In optical inspection of a surface defect of the magnetic recording medium after magnetic transfer, the surface of the magnetic recording medium must be very smooth in order to identify a minute defect caused by magnetic transfer, thus increasing the costs. A minute defect, if any on the magnetic recording medium before magnetic transfer, is difficult to discriminate from a defect caused by magnetic transfer. Minute foreign matter, if any, on the surface of the master information carrier, always generates a defect on the magnetic recording medium. The defect, therefore, constitutes a major problem even if it is minute.

Even if there is no abnormal protrusion or foreign matter on the master information carrier or the magnetic recording medium, external foreign matter may be caught between the master information carrier and the magnetic recording medium when magnetic transfer is performed. Waste dust from the magnetic transferring apparatus may cause a defect in some cases. In such a case, foreign matter remains on or a pit is generated in the surface of the magnetic recording medium after magnetic transfer.

SUMMARY OF THE INVENTION

In view of the above, it is a main object of the invention to provide a defect inspection method for securely and easily detecting a possibility of a minute defect being present on a magnetic recording medium owing to a protrusion etc. on a master information carrier or to foreign matter entered during magnetic transfer.

The other objects, features, and advantages of the invention will be apparent from the following.

In short, the invention relates to a defect inspection method for a master information carrier used in magnetic transferring of an information signal used for a tracking servo mechanism to a magnetic recording medium to be mounted into such a product as a magnetic recording/reproduction apparatus. The master information carrier has such a magnetic film pattern that corresponds to the information signal as to be magnetically transferred to the magnetic recording medium. In inspection of a defect possibly present on a master information carrier, the invention does not directly inspect this master information carrier but prepares an inspection substrate that corresponds to a relevant magnetic recording medium to then transfer onto this inspection substrate the defect possibly present on the master information carrier. The invention therefore carries out indirect inspection.

The invention employs indirect defect inspection in place of direct defect inspection. The reasons are as follows. In indirect defect inspection on a master information carrier, it is difficult to discriminate between a magnetic film pattern corresponding to an information signal and a defect such as an abnormal protrusion or foreign matter, so that a desired defect inspection accuracy cannot be obtained easily. To solve this problem, a defect possibly present on the master information carrier is transferred to the inspection substrate to be checked, in order to know about a defective situation on the master information carrier.

It is, however, not sufficient to simply transfer a defect possibly present on the master information carrier to the inspection substrate to then inspect it thereon. This is because, if any defect is present on the inspection substrate from the beginning, this defect may be mistook to be a defect on the master information carrier. Such a trouble must be avoided. The invention is created taking such a situation into account.

To avoid mistaking a defect on the inspection substrate to be that on the master information carrier, at least the following four requirements are taken into account. Here, an inspection substrate to which a defect possibly present a master information carrier is yet to be transferred is called "first-state inspection substrate" and that to which it is already transferred is called "second-state inspection substrate".

(1) Before a defect on a master information carrier is transferred to a inspection substrate, first a defect possibly on the first-state inspection substrate is inspected.

(2) Then, the first-state inspection substrate as finished with the defection inspection is brought in close contact with the master information carrier to thereby transfer the defect on the master information carrier to this inspection substrate as finished with the defect inspection. This results in the second-state inspection substrate.

(3) The second-state inspection substrate to which the defect is already transferred and which is separated from the master information carrier is inspected for a defect, if any thereon.

(4) A defect inspection result on the second-state inspection substrate and that on the first-state inspection substrate are compared to each other.

Any defect not present on the first-state inspection substrate but present on the second-state inspection substrate has a high probability of having been transferred from the master information carrier to the inspection substrate, that is, being a defect that was originally present on the master information carrier.

The invention works out such an idiosyncratic and subtle method, thus having the following effects. The master information carrier has formed thereon a magnetic film pattern that corresponds to an information signal for use in a tracking servo mechanism etc. and so finds it difficult to identify a defect such as an abnormal protrusion or foreign matter thereon. To inspect the defect on the master information carrier, the invention employs the above-mentioned indirect defect inspection method. Moreover, the invention attempts to overcome a new problem due to the indirect defect inspection. It is, therefore, possible to accurately inspect a defect on a master information carrier, which is such a fatal situation that it is originally difficult to identify a defect owing to the presence of a magnetic film pattern.

This new concept of the invention is accompanied by the following variety of novelties.

One solution is a defect inspection method for a master information carrier having a magnetic film pattern that corresponds to an information signal to be magnetically transferred to a magnetic recording medium, includes the following steps of:

(i) inspecting a defect possibly present originally on a first-state inspection substrate to which a defect on the master information carrier is to be transferred;

(ii) bringing the master information carrier in close contact with the first-state inspection substrate finished with defect inspection to thereby transfer the defect possibly present on the master information carrier to the inspection substrate finished with defect inspection;

(iii) inspecting a defect, if any, on the second-state inspection substrate to which the defect is already transferred and also which is separated from the master information carrier; and (iv) comparing a defect inspection result on the second-state inspection substrate and a defect inspection result on the first-state inspection substrate to each other to thereby decide the defect possibly present on the master information carrier.

That is, a defect present on a master information carrier such as an abnormal protrusion or foreign matter difficult to identify owing to a magnetic film pattern that corresponds to an information signal is transferred to an inspection substrate to then be inspected. It is, therefore, possible to improve the accuracy of inspecting a defect on the master information carrier.

A preferred embodiment concerning the above has the following additional step between the step of performing defect inspection on the first-state inspection substrate and the close contacting step. This additional step involves inspecting whether the number or the size of defects inspected on the first-state inspection substrate is not larger than a predetermined value and, if it is in excess of the value, stopping the on-going processing and, otherwise, going to the close contacting step.

This is indirect inspection, whereby a defect on the master information carrier is transferred to the inspection substrate. To employ such a totally novel method, a delicate care must be taken. Since magnetic transfer operation is performed in a closely contacted state as described above, defects present in excess of a predetermined number on an inspection substrate to which a defect on a master information carrier is to be transferred may have an adverse influence, for example, may give rise to a new defect on the master information carrier. It is just something as putting the cart before the horse. If any defects were found by defect inspection on the first-state inspection substrate before being closely contacted, the process inspects whether the number or the size of these defects is not larger than a predetermined value. If it exceeds the predetermined value, to avoid the above-mentioned adverse influence the process stops the on-going processing to then wash that inspection substrate or replace it with another, thus performing the defect inspection processing again. If it is not larger than the predetermined value, on the other hand, the process decides that no adverse influence is given to then go to the close contacting step. It is thus possible to implement good defect inspection on the master information carrier while preventing an adverse influence from occurring owing to the employment of the inspection substrate.

Another solution includes the following steps of:

(i) inspecting a defect possibly present originally on a first-state inspection substrate to which a defect on the master information carrier is to be transferred and also measuring, previously or afterward, a turned phase of the first-state inspection substrate with respect to a defect inspection unit;

(ii) bringing the master information carrier in close contact with the first-state inspection substrate as finished with defect inspection to then transfer the defect possibly present on the master information carrier to the inspection substrate finished with defect inspection;

(iii) inspecting any defect on the second-state inspection substrate to which the defect is already transferred to and which is separated from the master information carrier and also, previously or afterward, measuring a turned phase of the second-state inspection substrate with respect to the defect inspection unit;

(iv) correcting a phase shift based on the measured two turned phases; and (v) comparing a defect inspection result on the second-state inspection substrate and a defect inspection result on the first-state inspection substrate to each other to thereby decide the defect possibly present on the master information carrier.

This second solution has the following actions. That is, the inspection substrate is attached to the defect inspection unit to undergo defect inspection in the first state and then detached from it and then attached to a closely contacting unit to have the defect on the closely contacted master information carrier transferred thereto. Then, the inspection substrate is detached from the closely contacting unit to undergo defection inspection in the second state. The defect inspection unit used in the first-state defect inspection and that used in the second-state defect inspection may be the same or different, although the turned phase of the first-state inspection substrate and that of the second-state inspection substrate are not always the same as each other. They are rather expected to be shifted from each other. Accordingly, prior to comparison between the defect inspection result on the first-state inspection substrate and that on the second-state inspection substrate, turned-phase correction is to be carried out so that these two turned phases may be equal to each other. This turned phase correction operation is typically performed on the defect inspection result (data). This makes it possible to avoid deterioration in accuracy of the defect inspection result owing to a shift in turned phase.

According to this preferable embodiment, the turned phase correction is performed on a turned phase of a defect detected on the basis of detected light regularly reflected by the inspection substrate When light is applied thereto.

In this case, the regularly reflected light mainly comes from a pit (indentation) in the inspection substrate. Scattered light, on the other hand, mainly comes from foreign matter such as a particle on the inspection substrate. The scattered light fluctuates greatly in scattered direction and received light intensity with a delicate fluctuation in position and angle of laser beam application. The turned phase correction for the inspection substrate, therefore, is to be performed on the basis of a turned phase of a defect detected on the basis of detected regularly reflected light, which is stable in orientation and intensity. This makes it possible to further improve the defect inspection accuracy.

According to a variant, the turned phase correction operation is performed on a turned phase of a defect detected on the basis of a detected scattered light which comes from the inspection substrate when light is applied thereto. This means that the turned phase correction operation may be performed mainly based on scattered light. The accuracy of defect inspection, however, tends to be less than that by use of regularly reflected light.

According to another variant, the turned phase correction operation is performed on a defect detected on the basis of detected regularly reflected light or scattered light that comes from the inspection substrate when light is applied thereto while at the same time priority is given to the turned phase correction by use of the regularly reflected light. The actions in this case may be understood easily from the above description.

Note here that the above description only exemplifies utilization of regularly reflected light or scattered light in turned phase correction and should not be understood that the defect inspection is limited to utilization of regularly reflected light or scattered light. Defect inspection need not be limited to an optical system. For example, a scanning electron microscope (SEM) or any other publicly known system may be employed.

In the above, the following may be a preferred aspect. That is, during the step of defect inspection on the first-state inspection substrate, the defects present on the first-state inspection substrate is counted. Also, during the step of defect inspection on the second-state inspection substrate, the defects on the second-state inspection substrate is counted. Then, during the step of defect decision on the master information carrier through the comparison, the process decides whether a count of the defects on the first-state inspection substrate and that on the second-state inspection substrate are equal to each other. If, as a result, they are equal to each other, the process decides that the master information carrier has no defect thereon and, otherwise, decides that it has one thereon.

In this case, the actions are as follows. If the count M of the defects on the first-state inspection substrate is equal to the count N of the defects on the second-state inspection substrate (that is, M=N), the process decides that the master information carrier has no defect thereon and, if M≠N, on the other hand, decides that it has one. Such a decision method is comparatively simple and fast in processing. Note here that M and N may be 0.

In the above, the following may be another preferred aspect. That is, during the step of defect inspection on the first-state inspection substrate, position information of a defect on the first-state inspection substrate is extracted. Also, during the step of defect inspection on the second-state inspection substrate, position information of a defect on the second-state inspection substrate is extracted. Then, during the step of defect decision on the master information carrier through comparison, the process decides whether the position information of the defect on the first-state inspection substrate and that on the second-state inspection substrate are the same as each other. If, as a result, they are the same, the process decides that the master information carrier has no defect thereon and, otherwise, decides that it has one.

In this case, the actions are as follows. If the defect position information on the first-state inspection substrate is the same as that on the second-state inspection substrate, the process decides that the master information carrier has no defect thereon and, otherwise, decides that it has one. If it decides that the master information carrier has a defect thereon, the process then performs accurate inspection on the master information carrier and analyzes the defect. In doing so, the defect position information is used as a reference, which facilitates the obtaining of detailed data on which type of defect has which coordinates. That is, the process can easily decide whether the defects are an abnormal protrusion or foreign matter or even what distribution they have. This technology is useful in washing the substrate to re-utilize it.

In the above, according to a further preferred aspect, when defects are decided consecutively over a plurality of minute unit regions of those obtained by partitioning the whole region of the inspection substrate, the process accommodates this situation as follows. That is, the process regards this plurality of consecutive unit regions as one apparent region to obtain position information of one defect supposed to be located at or near the gravity center of that apparent region.

In this case, the actions are as follows. That is, the experiences tell that when a plurality of unit regions supposed to have a defect is consecutively present apparently, the process has possibly taken different sites of that single defect to be an individual defect. By regarding a defect which has a stripe shape having at least a certain length or which has at least a certain spread as one defect, the accuracy can be improved in defect inspection.

An additional preferred aspect may be as follows. That is, as the inspection substrate, one such is employed that it has at least a size corresponding to the maximum region of its own surface-directional position shift.

In this case, the actions are as follows. First, the background is explained. When a magnetic recording medium and a master information carrier are brought in close contact with each other, ideally they match completely in positional relationship. Note here that the master information carrier is to come in close contact not with an inspection substrate but with a magnetic recording medium. Actually, however, they are shifted from each other a little. This is called a surface-directional position shift. The shift amount is on the order of a few micrometers to a few hundreds of micrometers. The maximum region of the surface-directional position shift refers to such a region as to have an external profile of the magnetic recording medium plus the shift amount. Even if there is no defect in an area corresponding to the magnetic recording medium on the master information carrier, there may be a defect in some cases in a very thin annular region (extremely thin annular region) between the maximum region of the surface-directional position shift and the external profile of the magnetic recording medium.

When the extremely thin annular region of that master information carrier has a defect, in particular, foreign matter and if the master information carrier encounters a position shift with respect to the magnetic recording medium, the foreign matter present in the extremely thin annular region butts against the surface of the magnetic recording medium. That is, it interferes with the close contact between the master information carrier and the magnetic recording medium throughout the surfaces thereof. It may degrade the accuracy in magnetic transferring of an information signal of the master information carrier to the magnetic recording medium. Taking a surface-directional position shift into account, therefore, it is necessary to inspect also the extremely thin annular region when inspecting whether there is a defect on the master information carrier to be brought in close contact with the magnetic recording medium.

Suppose here that an inspection substrate and a magnetic recording medium have the same size. If the master information carrier and the inspection substrate are brought in close contact with each other exactly in a coaxial manner with no surface-directional position shift therebetween, foreign matter, if any, in the extremely thin annular region of the master information carrier may be overlooked. Note here that the master information carrier is to come in close contact with the inspection substrate. If the master information carrier in this case is used as a normal one in magnetic transfer of the information signal, it may contribute to the above-mentioned deterioration in magnetic transfer.

The following two methods are suggested to inspect defects including an extremely thin annular region on the master information carrier.

It may be considered that such an inspection substrate is employed as to have the same size as that of a magnetic recording medium to which an information signal of a magnetic film pattern is magnetically transferred from the master information carrier. It will be described later. Here, such an inspection substrate is exemplified as to be larger in size than the magnetic recording medium.

The region in the external profile of the magnetic recording medium plus the extremely thin annular region constitutes the maximum region of the surface-directional position shift. Such an inspection substrate is employed here as to have at least a size that corresponds to the maximum region of this surface-directional position shift. This comparatively large sized inspection substrate itself covers the extremely thin annular region. Even if the surface-directional position shift occurs to any extent between the master information carrier and the inspection substrate when they are brought in close contact with each other, the maximum region of the surface-directional position shift in the master information carrier can surely be brought in close contact with the inspection substrate. That is, foreign matter, if any, in the extremely thin annular region is surely transferred to the inspection substrate. In short, it is possible to avoid overlooking of the presence of foreign matter in the extremely thin annular region, thus improving the accuracy in defect inspection of the master information carrier.

In addition, in contrast to the case by a later-described method of using them having the same size, the master information carrier and the inspection substrate are brought in close contact with each other a plurality of times at different close contacting positions, this method need not carry out repetitive close contacting operations accompanied by a change in the close contacting position but needs to perform close contacting only once, thus improving the inspection efficiency.

The following will describe a method of using the inspection substrate that has almost the same size as that of the magnetic recording medium. This method takes into account a surface-directional position shift which occurs when the master information carrier and the inspection substrate are brought in close contact with each other. By this method, the master information carrier and the inspection substrate are brought in close contact with each other a plurality of times at different close contacting positions so that the inspection substrate having almost the same size as that of the magnetic recording medium may come in close contact with the overall maximum region of that surface-directional position shift in the master information carrier.

In this case, the actions are as follows. That is, by bringing the master information carrier and the inspection substrate in close contact with each other a plurality of times with different close contacting positions, the overall maximum region of the surface-directional position shift including the extremely thin annular region in the master information carrier can come in close contact with the inspection substrate. Therefore, foreign matter, of any, in the extremely thin annular region is surely transferred to the inspection substrate. It is thus possible to avoid overlooking of the foreign matter present in the extremely thin annular region, thus improving the accuracy in defect inspection on the master information carrier.

In addition, by originally using such an inspection substrate as to have the same size as that of the magnetic recording medium to which the information signal of the magnetic film pattern is magnetically transferred from the master information carrier, it is possible to use in a diverted manner the magnetic recording medium or its primary board as the inspection substrate. This means that a dedicated inspection substrate need not be manufactured in particular. It is, therefore, possible to simplify the defect inspection facilities and reduce the costs.

From this it is further said that the inspection substrate may be in some cases smaller than the magnetic recording medium. By repeating close contacting with different close contacting positions, this small size in inspection substrate can be accommodated. These conditions are also covered by the invention.

An additional preferred aspect may also be given as follows. That is, the inspection substrate employed is mainly made of the same material as a main constituent material of the magnetic recording medium. This is based on such a concept that a magnetic recording medium manufactured or a semi-finished magnetic recording medium in process of manufacture should be used as the inspection substrate in a diverted manner, to enable reducing the costs.

According to an additional preferred aspect, such an inspection substrate is also used as to have a lower hardness than that of the master information carrier.

In this case, the actions are as follows. That is, if conversely such an inspection substrate is used as to have at least the same hardness as that of the master information carrier, the inspection substrate hardly has an indentation owing to foreign matter or an abnormal protrusion present on the master information carrier. By using such an inspection substrate as to have a lower hardness than the master information carrier, an indentation due to foreign matter or an abnormal protrusion on the master information carrier can surely be produced in the inspection substrate. It is, therefore, possible to securely detect the abnormal protrusion or foreign matter on the master information carrier by using an inspection substrate.

According to an additional preferred aspect, the inspection substrate is also exempted from lubricant application on the magnetic recording medium.

In this case, the actions are as follows. That is, typically lubricant is applied on the uppermost layer of a magnetic recording medium as finished. This serves a purpose of preserving smoothness of the magnetic recording medium. If this lubricant-applied magnetic recording medium is used as an inspection substrate, the inspection substrate has also lubricant applied thereon. If the lubricant-applied inspection substrate is used, foreign matter, if any, on the master information carrier is hardly absorbed by the inspection substrate. To solve this problem, an inspection substrate free of lubricant is used to thereby improve absorption of foreign matter on the master information carrier. This makes it possible to securely detect foreign matter present on the master information carrier by using an inspection substrate.

According to an additional preferred aspect, the inspection substrate employed has its close contacting surface magnetized.

In this case, the actions are as follows. That is, if an abnormal protrusion is present in a magnetic film pattern of the master information carrier, the magnetic film may peel off from the master information carrier owing to the close contacting/separation. If the inspection substrate has a magnetic property on its surface, the peeled-off magnetic layer can securely be absorbed magnetically to the inspection substrate, thus preventing the surface of the master information carrier from being contaminated by the peeled-off magnetic film.

The invention also relates to a magnetic transfer method for a magnetic film pattern by use of a master information carrier. This method specifically uses a master information carrier that is decided to be acceptable through defect inspection by the above-mentioned defect inspection method. An information signal based on the magnetic film pattern on the master information carrier is transferred to the magnetic recording medium magnetically. In this case, the surface of the master information carrier on which the magnetic film pattern is formed is brought in close contact with the magnetic recording medium, on which in turn is applied an external magnetic field to thereby transfer the information signal based on the magnetic film pattern on the master information carrier to the magnetic recording medium.

According to another aspect, the master information carrier-utilization magnetic transfer method for a magnetic film pattern uses a master information carrier that is decided to be acceptable through defect inspection by the above-mentioned defect inspection method. In this case, the magnetic film pattern of the master information carrier is magnetized beforehand. Then, the surface of the master information carrier on which the magnetized magnetic film pattern is formed is brought in close contact with the magnetic recording medium to thereby magnetically transfer the information signal based on the magnetic film pattern of the master information carrier to the magnetic recording medium.

These two methods differ from each other in whether an external magnetic field is applied to the magnetic film pattern or it is magnetized beforehand instead. These methods both use a master information carrier which has passed through the defect inspection appropriately to then magnetically transfer an information signal based on the magnetic film pattern to the magnetic recording medium, thus implementing magnetic transfer of the information signal efficiently and accurately.

The invention relates also to a defect inspection method for a magnetic recording medium. The method uses a master information carrier decided to be acceptable through defect inspection to then magnetically transfer an information signal thereon to the magnetic recording medium. Even if such an acceptable master information carrier is employed, however, there is a possibility that external foreign matter may be caught between the master information carrier and the magnetic recording medium when they are brought in close contact with each other. In this case, a defect such as a pit caused by pressing of the foreign matter may possibly occur on the magnetic recording medium after magnetic transfer. This defect is to be inspected.

The defect inspection method for a magnetic recording medium according to the invention includes the steps of:

(i) inspecting a defect possibly present originally on a magnetic recording medium before transfer;

(ii) bringing a master information carrier in close contact with the pre-transfer magnetic recording medium after defect inspection to thereby magnetically transfer an information signal based on a magnetic film pattern of the master information carrier to the pre-transfer magnetic recording medium after defect inspection;

(iii) inspecting a defect on the post-transfer magnetic recording medium after it is separated from the master information carrier; and (iv) comparing a defect inspection result on the post-transfer magnetic recording medium and a defect inspection result on the pre-transfer magnetic recording medium to each other to thereby decide such a defect on the magnetic recording medium as to be caused by the transfer step.

It is thus possible to secure detection of a defect caused by magnetic transfer and improve the accuracy in inspection of a defect on the magnetic recording medium. Through this defect inspection, the reliability can be improved in the magnetic recording/reproducing apparatus.

According to an additional preferred aspect of the above-mentioned defect inspection method for a magnetic recording medium, the following step is added between the step of defect inspection on the pre-transfer magnetic recording medium and the step of close contacting. That is, the process inspects whether the number or the size of defects inspected on the pre-transfer magnetic recording medium is not larger than a predetermined value and, if it is in excess of the value, stops the on-going processing and, otherwise, goes to the close contacting step.

In this case, the actions are as follows. If external foreign matter is caught during magnetic transfer between the master information carrier and the magnetic recording medium when they are brought in close contact with each other, the foreign matter thus caught may possibly have an adverse influence such as production of a defect on the magnetic recording medium or the master information carrier because the magnetic transfer operation is carried out in a close contact state. A defect once produced on the master information carrier would cause a similar defect to occur in a number of magnetic recording media processed one after another, thus giving rise to a major problem. To guard against this, if defects are detected through defect inspection on a pre-transfer magnetic recording medium, the process inspects whether the number and/or size of these defects is not larger than a predetermined value. If it is in excess of the predetermined value, the process stops the on-going processing to avoid the adverse influence to then wash it or replace it with another magnetic recording medium and then performs defect inspection again. If it is not larger than the predetermined value, the process decides that no adverse influence is given to then go to the close contact step. Thus, the master information carrier can be prevented from having a new defect.

A further solution of the defect inspection method for a magnetic recording medium according to the invention includes the steps of:

(i) inspecting a defect possibly present on a pre-transfer magnetic recording medium originally and also, previously or afterward, measuring a turned phase of the pre-transfer magnetic recording medium with respect to defect inspection unit;

(ii) bringing a master information carrier in close contact with the pre-transfer magnetic recording medium as finished with defect inspection to then magnetically transfer an information signal based on a magnetic film pattern of the master information carrier to the pre-transfer magnetic recording medium as finished with defect inspection;

(iii) inspecting a defect on the post-transfer magnetic recording medium as separated from the master information carrier and also, previously or afterward, measuring a turned phase of the post-transfer magnetic recording medium with respect to the defect inspection unit;

(iv) correcting a shift in phase based on the two measured turned phases; and (v) comparing a defect inspection result on the post-transfer magnetic recording medium and a defect inspection result on the pre-transfer magnetic recording medium to each other to thereby decide a defect produced on the magnetic recording medium by the transfer step.

In this case, the actions are as follows. That is, a magnetic recording medium is attached to defect inspection unit to undergo defect inspection in a pre-transfer state and then detached therefrom to be moved to close-contacting unit so that a defect on a master information carrier may be transferred to it in a close contact state. The magnetic recording medium is then detached from the close-contacting unit to be moved to the defect inspection unit again so that it may undergo defect inspection in a post-transfer state. The defect inspection unit used in defect inspection in the pre-transfer state and that used in defect inspection in the post-transfer state may be the same or different, although a turned phase of the magnetic recording medium in the pre-transfer state and that in the post-transfer state do no always coincide with each other. It is expected that a shift would rather occur in phase. To guard against this, prior to comparison between a defect inspection result on the magnetic recording medium in the pre-transfer state and that in the post-transfer state, the process conducts turned phase correction so that the two turned phases may be coincident with each other. This turned-phase correction operation is typically conducted on the defect inspection result (data). This makes it possible to avoid deterioration in accuracy of the defect inspection result caused by a shift in turned phase, thus improving the defect inspection accuracy.

In the above, according to a preferred aspect, the turned-phase correction is performed on a turned phase of a defect detected based on light regularly reflected by the magnetic recording medium when light is applied thereto.

The difference between regularly reflected light and scattered light has been described already. The turned phase of a detected defect is captured on the basis of regularly reflected light detected, which is more stable in orientation and intensity than the other. It is thus possible to further improve the defect inspection accuracy.

According to another preferred aspect, the turned-phase correction is performed on a turned phase of a defect detected on the basis of light scattered by the magnetic recording medium when light is applied thereto. This means that the turned-phase correction may be performed using scattered light mainly.

According to a further preferred aspect, the turned-phase correction is performed on a turned phase of a defect detected on the basis of light regularly reflected or scattered by the magnetic recording medium when light is applied thereto while at the same time giving a priority to the turned-phase correction for the defect detected based on the regularly reflected light.

In the above, the following may be a preferably aspect. That is, in the step of defect detection on the pre-transfer magnetic recording medium, the defects on the pre-transfer magnetic recording medium are counted. In the step of defect inspection on the post-transfer magnetic recording medium also, the defects on the post-transfer magnetic recording medium are counted. Then, in the step of defect decision through comparison on the magnetic recording medium, the process decides whether the count of the defects on the pre-transfer magnetic recording medium and that on the post-transfer magnetic recording medium are the same. If, as a result, they are the same as each other, the process decides that the magnetic recording medium has no defect and, otherwise, decides that it has one. This aspect provides a relatively simple method and fast in decision processing.

In the above, the following may be another preferred aspect. That is, in the step of defect inspection on the pre-transfer magnetic recording medium, position information of a defect on the pre-transfer magnetic recording medium is extracted. In the step of defect inspection on the post-transfer magnetic recording medium also, position information of a defect on the post-transfer magnetic recording medium is extracted. Then, in the step of defect decision through comparison on the magnetic recording medium, the process decides whether the position information of the defect on the pre-transfer magnetic recording medium and that on the post-transfer magnetic recording medium are the same as each other. If as a result they are the same, the process decides that the magnetic recording medium has no defect thereon and, otherwise, decides that it has one.

In this case, the actions are as follows. This method uses the position information of a defect as a reference and so advantageous in obtaining of detailed data on what type of defects are in which coordinates. That is, it is easy to decide whether the defects are an abnormal protrusion or foreign matter and even what distribution they have. This is an effective technology in washing the magnetic recording medium to re-utilize it.

In the above, according to a further preferred aspect, when defects are decided consecutively over a plurality of minute unit regions of those obtained by partitioning the whole region of the magnetic recording medium, the process accommodates this situation as follows. That is, the process regards this plurality of consecutive unit regions as one apparent region to obtain position information of one defect supposed to be located at or near the gravity center of that apparent region.

In this case, by regarding a defect which has a stripe shape having at least a certain length or which has at least a certain spread as one defect, the accuracy can be improved in defect inspection.

The invention relates to a magnetic recording/reproducing apparatus also, which includes a disk-shaped magnetic recording medium to which the information signal is magnetically transferred by the above-mentioned magnetic transferring method and a magnetic head for performing the recording/reproducing operation to the disk-shaped magnetic recording medium. This magnetic recording/reproducing apparatus is thus mounted with a disk-shaped magnetic recording medium to which the information signal based on a magnetic film pattern of the master information carrier is magnetically transferred at a high accuracy, thus being excellent in control of the tracking servo mechanism etc.

BRIEF DESCRIPTION OF THE DRAWINGS

These and other objects as well as advantages of the invention will become clear by the following description of preferred embodiments of the invention with reference to the accompanying drawings, wherein:

FIG. 18 is a table for showing a result of enumerating defects with a turned phase shift amount of 10 degrees or less and a position shift amount of 0.5 mm or less of those detected by a photo-receptor element in a regularly reflected light reception system in the first embodiment of the invention;

FIG. 29 is a table for showing a result of enumerating defects with a turned phase shift amount of 10 degrees or less and a position shift amount of 0.5 mm or less of those detected by a regularly reflected light receptor element R in the third embodiment of the invention;

In all these figures, like components are indicated by the same numerals.

DESCRIPTION OF THE PREFERRED EMBODIMENTS

The following will describe preferred embodiments of the invention with reference to the drawings.

First Embodiment

Magnetic transfer in the first embodiment of the invention is described with reference to FIGS. 1 to 11 as follows.

Figure 1:
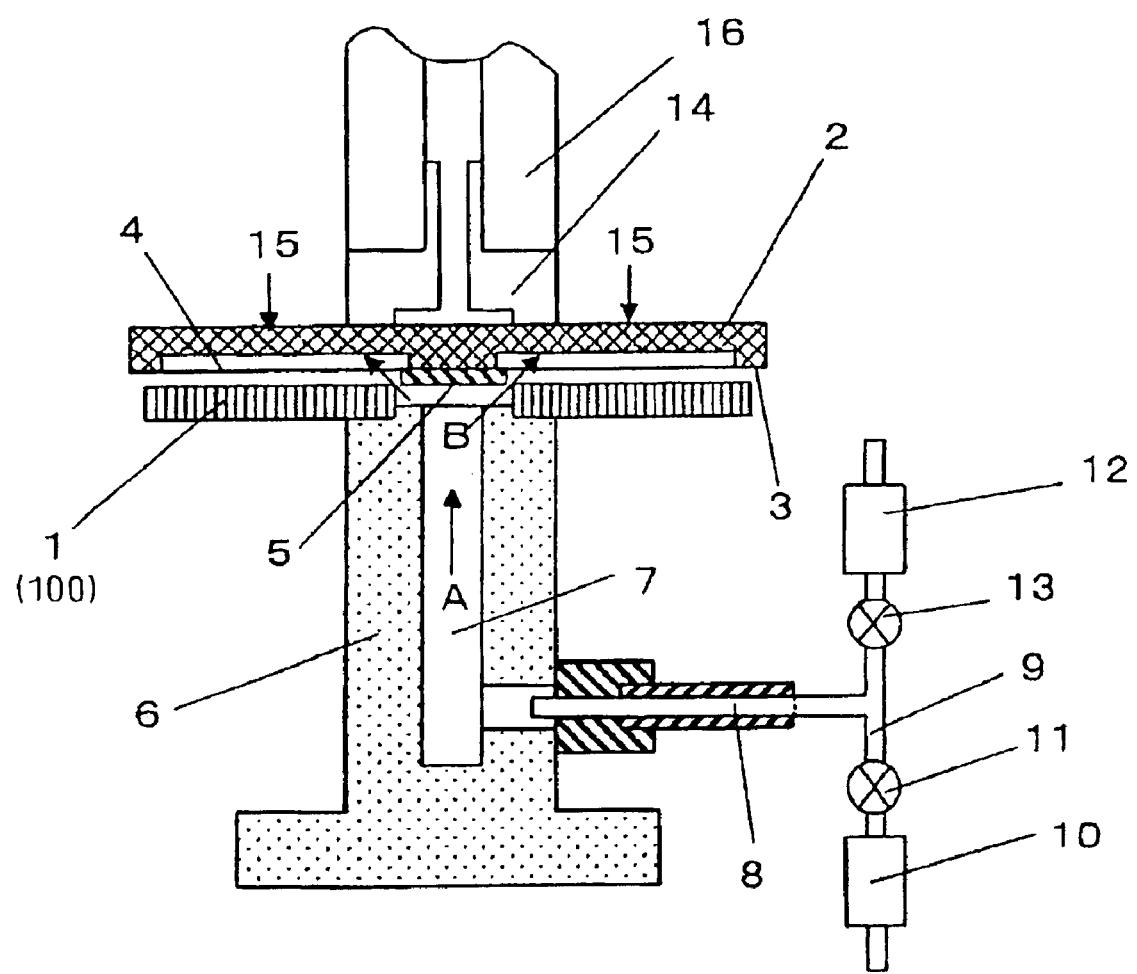
FIG. 1 is a cross-sectional view for showing a state where a master information carrier and a magnetic recording medium are separated from each other in a first embodiment of the invention.

FIG. 1 is a cross-sectional view of a magnetic transferring apparatus. In FIG. 1, a reference numeral 1 indicates a magnetic recording medium (magnetic disk) and a reference numeral 2 indicates a master information carrier. A reference numeral 3 indicates a contact surface of the master information carrier 2 which comes in contact with the magnetic recording medium 1. In the contact surface 3 is formed a groove 4 extending in a radial manner from the center of the master information carrier 2. In this embodiment, the groove depth is set at 5 $\mu$m or so. A reference numeral 5 indicates a boss fixed to the master information carrier 2 at its middle and a reference numeral 6 indicates a support table for supporting the magnetic recording medium 1. The support table 6 has a vent slot 7 formed therein for flowing air through its center. A reference numeral 8 indicates a passage through which air present between the magnetic recording medium 1 and the master information carrier 2 is exhausted and also air is sent as compressed into the groove 4 provided as a space between the two, a reference numeral 9 indicates an air outlet for exhausting air through the passage 8, a reference numeral 10 indicates an inhaler pump, a reference numeral 11 indicates an exhaust valve for controlling exhaustion of air, a reference numeral 12 indicates an air supply pump for sending air under pressure, and a reference numeral 13 indicates an air supply valve for controlling air supply. The air supply pump 12 is mounted with a 0.01 $\mu$m air filter to prevent foreign matter with a size of 0.01 $\mu$m from entering the passage 8. A reference numeral 14 indicates a holding arm for holding the master information carrier 2 as fixed thereto. The fixation unit used for this purpose may be an adhesive agent etc. or, as shown in FIG. 1, the master information carrier 2 may be sucked through a through hole formed in the holding arm 14. Further, the holding arm 14 is positioned so as to be slid by a guide member 16 vertically through the boss above it.

Figure 4:
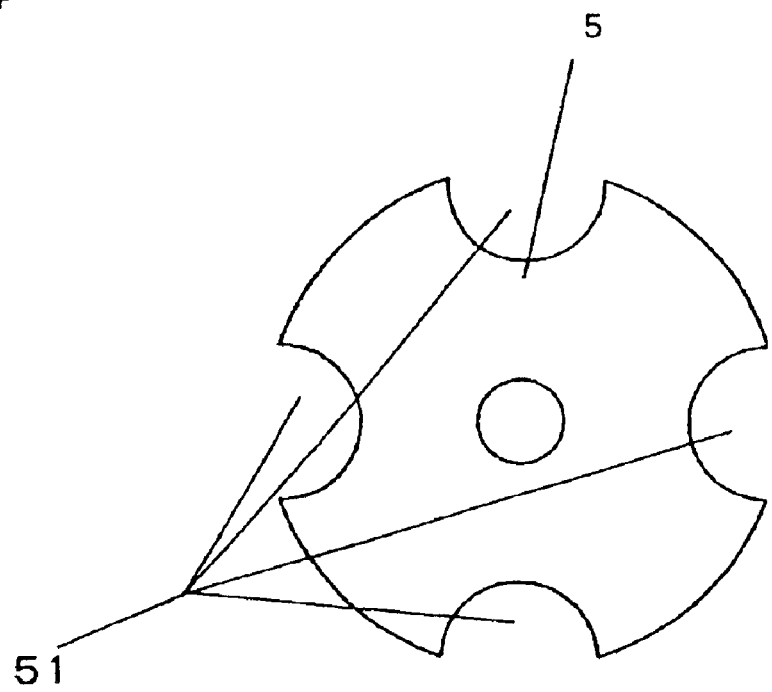
FIG. 4 is an illustration for showing a shape of a boss in the first embodiment of the invention.

However, the master information carrier 2 may be positioned not only by using the holding arm 14 but also by, for example, fitting an outer periphery of the boss 5 into an inner periphery slot in the magnetic recording medium 1. In such a case, the boss 5 has such a shape as shown in FIG. 4 so that air present between the magnetic recording medium 1 and the master information carrier 2 may be exhausted or sent as compressed through a notch 51 formed in the outer periphery of the boss 5.

Next, a step of inhaling/compression is described with reference to FIGS. 1 to 3. First, a step of separation by means of compression is described with reference to FIG. 1. By closing the exhaust valve 11 and opening the air supply pump 13 to then operate the air supply pump 12, air is flown to the passage 8. Then, air is sent upward as compressed through the vent slot 7 as shown by an arrow A in FIG. 1. This causes air compressed through the vent slot 7 to press the boss 5 upward and then, as shown by an arrow B, is compressed into the groove 4. Air thus compressed into the groove 4 is spread therethrough in a radial manner from the center of the master information carrier to its outer periphery. It further goes through the groove 4 and escapes to the atmosphere from a gap between the magnetic recording medium 1 and the master information carrier 2.

Figure 5:
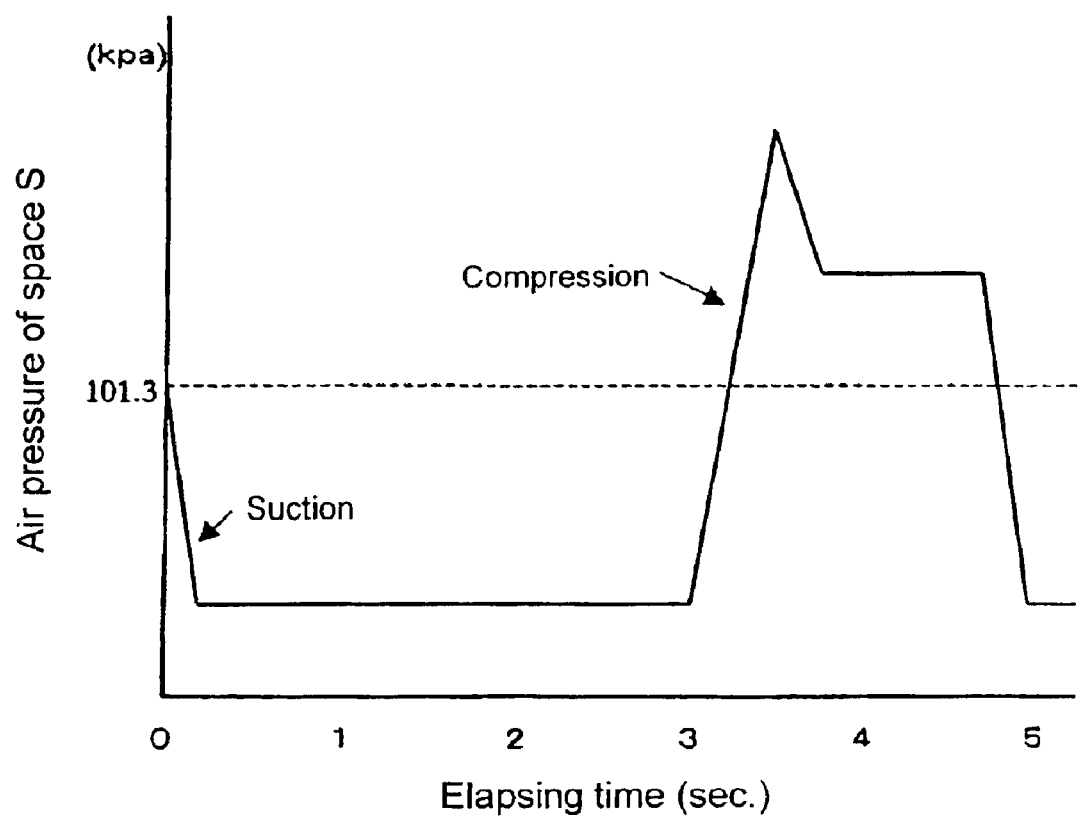
FIG. 5 is a graph for showing a relationship between an elapsing time and an air pressure of a close contact space in the first embodiment of the invention.

A relationship between an elapsing time and an air pressure of a space (hereinafter called space S) between the magnetic recording medium 1 and the master information carrier 2 is shown in FIG. 5. As shown in FIG. 5, when the time elapses three seconds or so, the air pressure of space S rises instantaneously from 101.3 kpa and then is kept at a pressure of 130 kpa for an interval of one second or so, which interval corresponds to the above-mentioned state where the magnetic recording medium 1 and the master information carrier 2 are separated from each other.

In this embodiment, when the master information carrier 2 which has been in close contact with the magnetic recording medium 1 is raised by 0.5 mm integrally with the holding arm 14, the upper surface of the holding arm 14 butts against the lower surface of the guide member 16 so that the distance can be controlled between the magnetic recording medium 1 and the master information carrier 2.

Next, a step of close contacting by means of inhaling is described as follows.

The air supply pump 12 is stopped and the air supply valve 13 is closed. Then, the holding arm 14 which has fixed the magnetic recording medium 1 thereto moves downward by its own weight, so that the boss 5 is loaded on the magnetic recording medium 1 as fit into the inner peripheral slot. Then, the exhaust valve 11 is opened to operate the inhaler pump 10. Then, as shown by an arrow C in FIG. 2, air in the vent slot 7 is exhausted downward, so that air in the groove, that is, in space S is also exhausted through a gap between the inner peripheral slot in the magnetic recording medium 1 and the boss 5. Note here that the groove 3 does not extend to the outermost periphery of the master information carrier 2 as shown in FIG. 3. As such, at the outermost-peripheral donut-shaped portion, the master information carrier 2 and the magnetic recording medium 1 are in a close-contact state all over the circumference. Space S, therefore, is enclosed and its pressure becomes lower than the atmospheric pressure. The magnetic recording medium 1 is, therefore, pressed against the master information carrier 2 by an atmospheric pressure 15.

In FIG. 5, an interval where the air pressure of space S is held at 30 kpa or so corresponds to the above-mentioned close-contact state.

Next, as magnet 17 is moved in a direction of an arrow D until it may come close to the master information carrier 2 down to a position about 1 mm above it, whereupon it is stopped in the movement and then turned toward arrow E by at least one revolution in a direction of the circumference of the magnetic recording medium, that is, around the guide member 16, thus giving rise to a magnetic field (external field) necessary for transfer.

Thus, in magnetic transfer, the magnetic recording medium 1 is involved in only close containing/compression operations, so that it has no large shift in turned phase owing to magnetic transferring.

The master information carrier 2 is detailed with reference to FIGS. 6 to 8 as follows.

Figure 6:
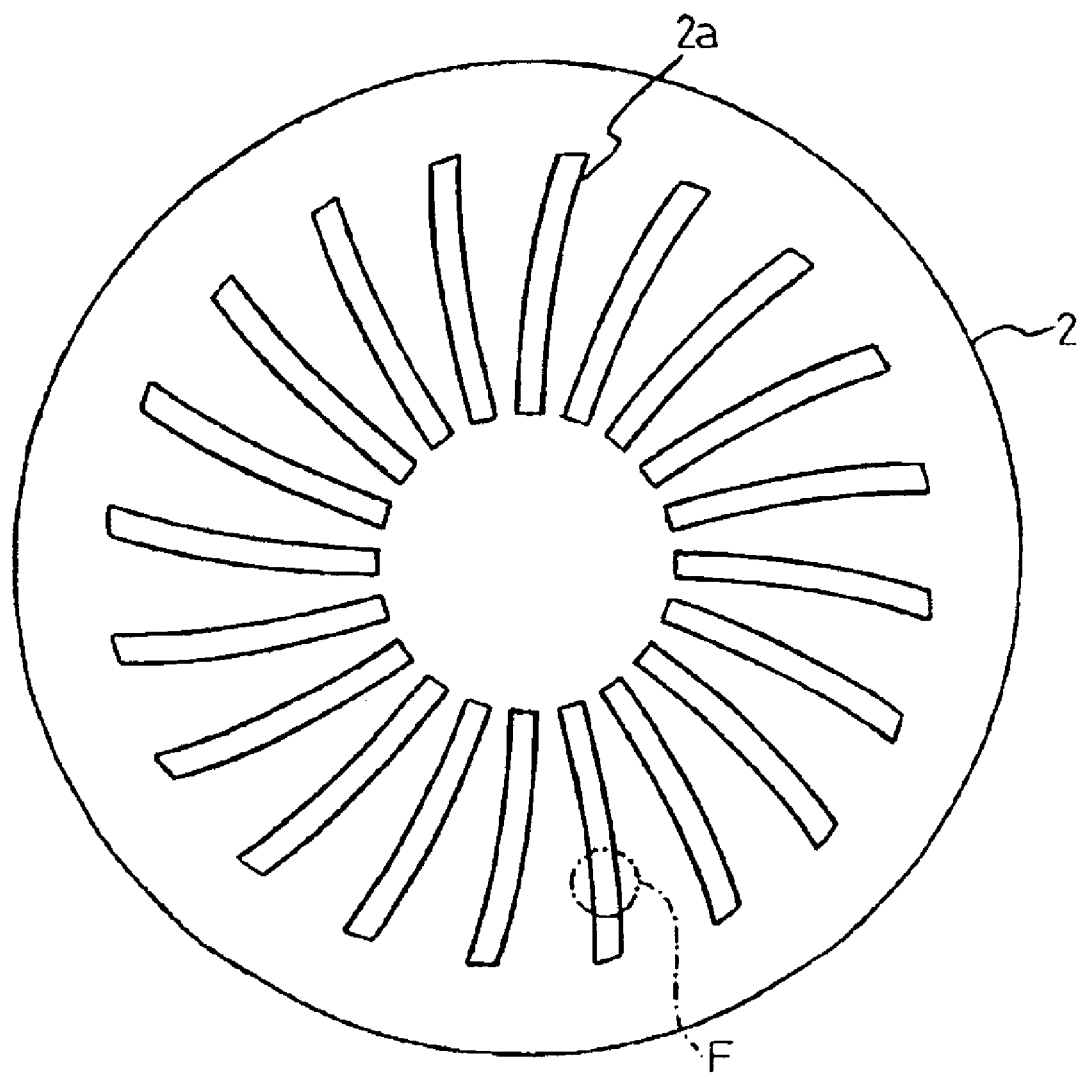
FIG. 6 is a schematic illustration for showing a plane of one example of the master information carrier in the first embodiment of the invention.

As shown in FIG. 6 schematically illustrating a plane of one example of the master information carrier 2, a signal region 2*a* is formed in a roughly radial manner in one main surface of the master information carrier 2, that is, in a side surface thereof that comes in contact with the ferromagnetic thin film surface of the magnetic recording medium 1. Despite the schematic illustrations of FIGS. 3 to 6, the signal region 2*a* shown in FIG. 6 is actually formed in the contact surface shown in FIG. 3.

Figure 7:
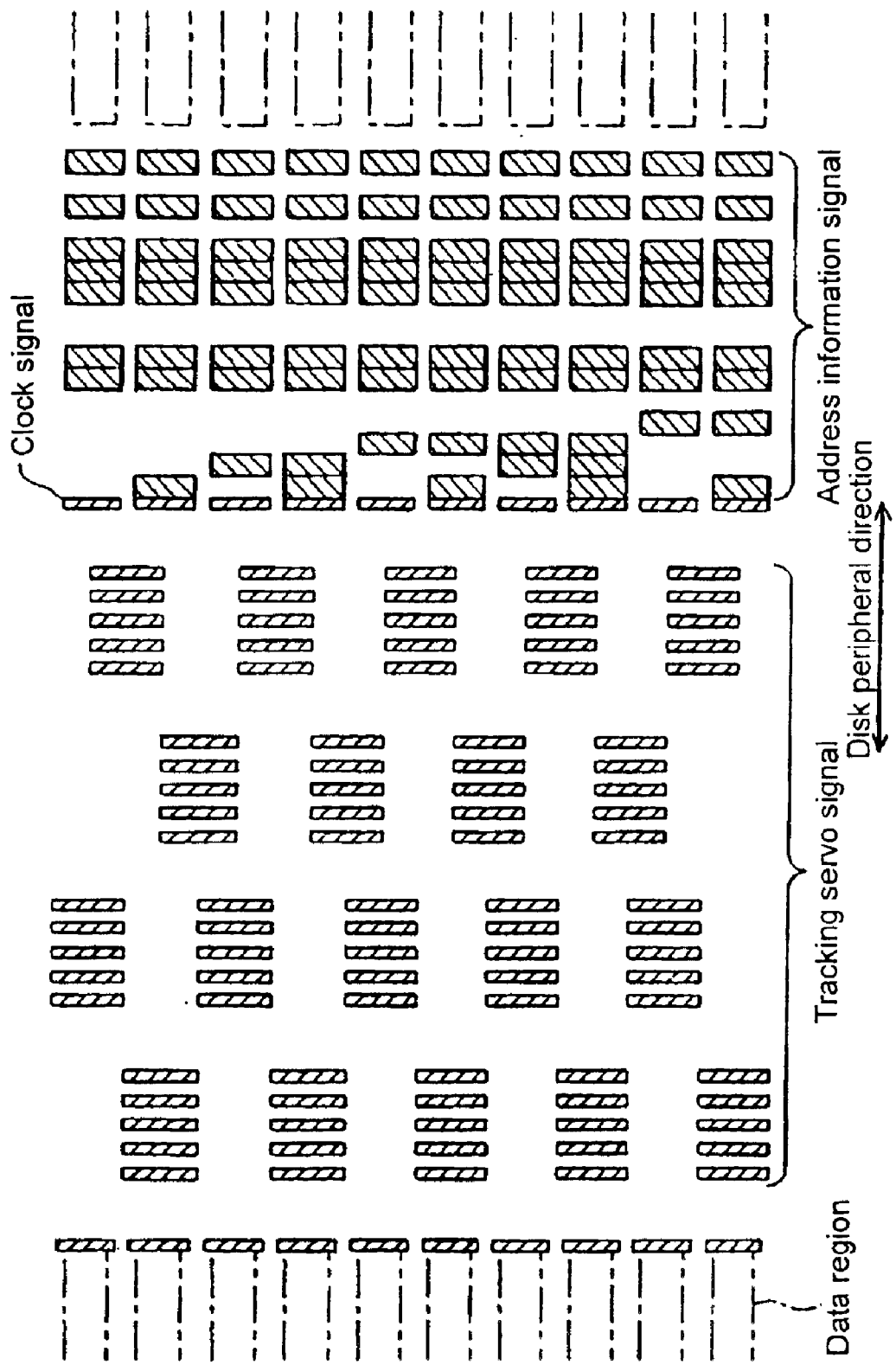
FIG. 7 is an expanded view for showing part F of FIG. 6 in the first embodiment of the invention.

Portion F enclosed by a dotted line in FIG. 6 is shown as expanded in FIG. 7. As shown in FIG. 7, in the signal region 2*a* is formed a pattern of a digital information signal to be recorded to the magnetic recording medium 1. For example, at a position that corresponds to a pre-format record is formed a master information pattern by means of a magnetic portion made of a ferromagnetic thin film in a pattern shape that corresponds to the digital information signal.

In FIG. 7, a hatched portion provides the magnetic portion made of the ferromagnetic thin film. In the master information pattern shown in FIG. 7 are arrayed, in the track length direction, regions for a clock signal, a tracking servo mechanism signal, an address information signal, etc. in this order. Note here that the master information pattern shown in FIG. 7 is just one example, so that its configuration, layout, etc. are determined appropriately according to the digital information signal recorded to the magnetic recording medium.

For example, there is a case where, like in a hard disk drive, first a reference signal is recorded on a magnetic film of a hard disk to then record the tracking servo mechanism signal etc. in a pre-format based on this reference signal. In such a case, the master information carrier according to the invention is used to record in a transfer manner only the reference signal on the magnetic film of the hard disk. Then, this hard disk is mounted in the cabinet of the drive. The tracking servo mechanism signal etc. may be recorded in a pre-format by utilizing a magnetic head of the hard disk drive.

Figure 8:
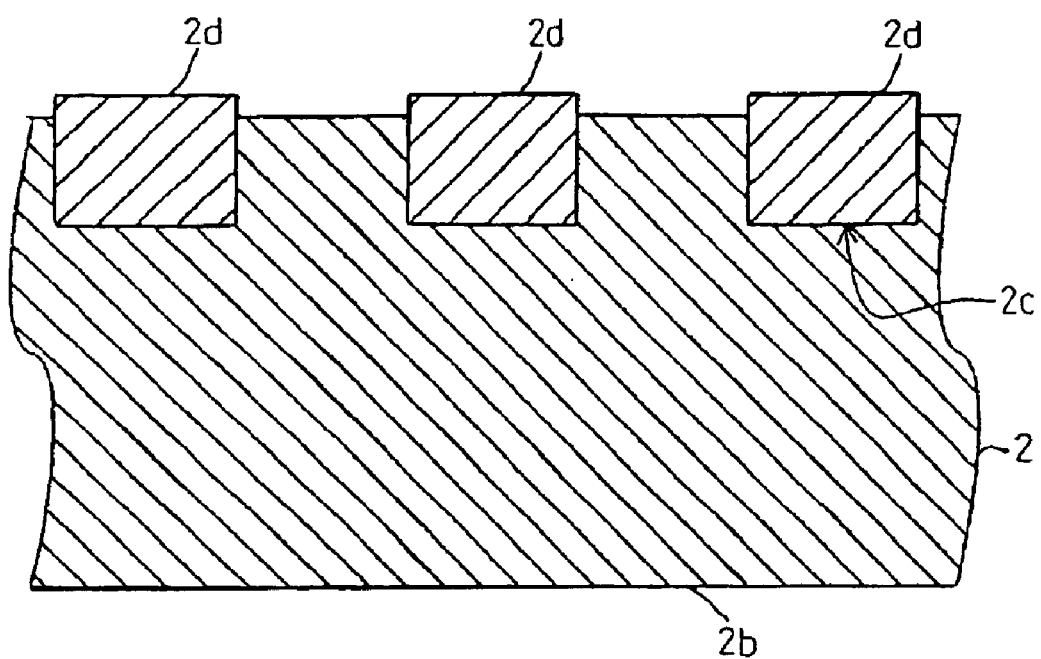
FIG. 8 is a partially sectional view for showing the region shown in FIGS. 6 and 7 in the first embodiment of the invention.

The region shown in FIGS. 6 and 7 is shown in a cross section in FIG. 8.

As shown in FIG. 8, in one main surface of a disk-shaped base plate made of a nonmagnetic material of the master information carrier 2 is formed a plurality of recesses 2*c* in a fine array pattern that corresponds to the information signal. In this recess 2*c* is buried a ferromagnetic thin film 2*d*, which provides the magnetic portion. The base plate 2*b* is made of silicon, glass, plastic, etc. The main surface of the base plate 2*b* comes in contact with the surface of the magnetic recording medium 1. The ferromagnetic thin film 2*d* may be made of a variety of magnetic materials including a hard magnetic material, a semi-hard magnetic material, and a soft magnetic material as far as it is capable of recording the digital information signal in a transfer manner on the magnetic recording medium 1. It is, for example, Fe, Co, an Fe—Co alloys, etc.

Note here that although it depends on a bit length, saturation magnetization of the magnetic recording medium, and a film thickness of the magnetic layer, the thickness of the ferromagnetic thin film layer 2*d* needs to be about 50 to 500 nm when, for example the bit length is about 1 μm, the saturation magnetization of the magnetic recording medium is about 500 emu/cc, and the thickness of the magnetic layer of the magnetic recording medium is about 20 nm.

Note here that in such a recording method, to obtain a good recording signal quality, preferably a pre-format is excited and magnetized uniformly when it is recorded on the basis of an array pattern of a soft or semi-soft magnetic thin film provided as a ferromagnetic thin film on the master information carrier. Also, preferably the magnetic recording medium such as a hard disk is uniformly demagnetized using a DC current prior to recording the signal using the master information carrier.

The following will describe a method of manufacturing the master information carrier 2.

That is, a master information carrier provided with a magnetic portion corresponding to an information signal used in a recording method of the invention is obtained by forming a resist film on a surface of a silicon substrate, exposing and developing the resist film by photolithography by use of a laser beam or lithography by use of an electron beam to thereby pattern it, etching it by dry etching to thereby form fine irregularities thereon corresponding to the information signal, and burying in a recess a ferromagnetic thin film made of Co etc. by sputtering, vacuum evaporation, ion implantation, CVD, plating etc.

Note here that the fine irregularities may be formed on the surface of the master information carrier not only by this method but also by, for example, directly forming them using a laser beam, an electron beam, or an ion beam or by machining.

Figure 9:
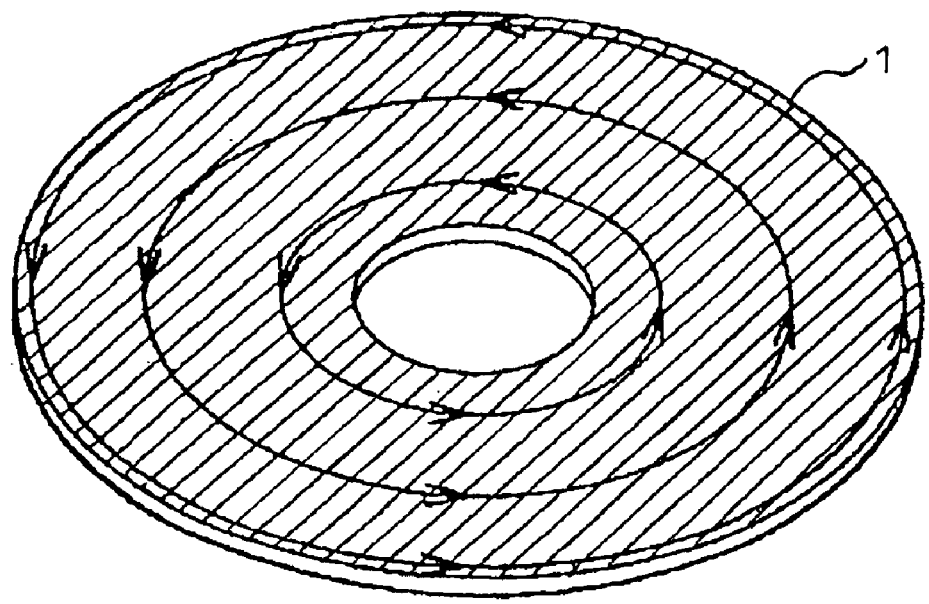
FIG. 9 is an illustration for showing initialization in the first embodiment of the invention.
Figure 10:
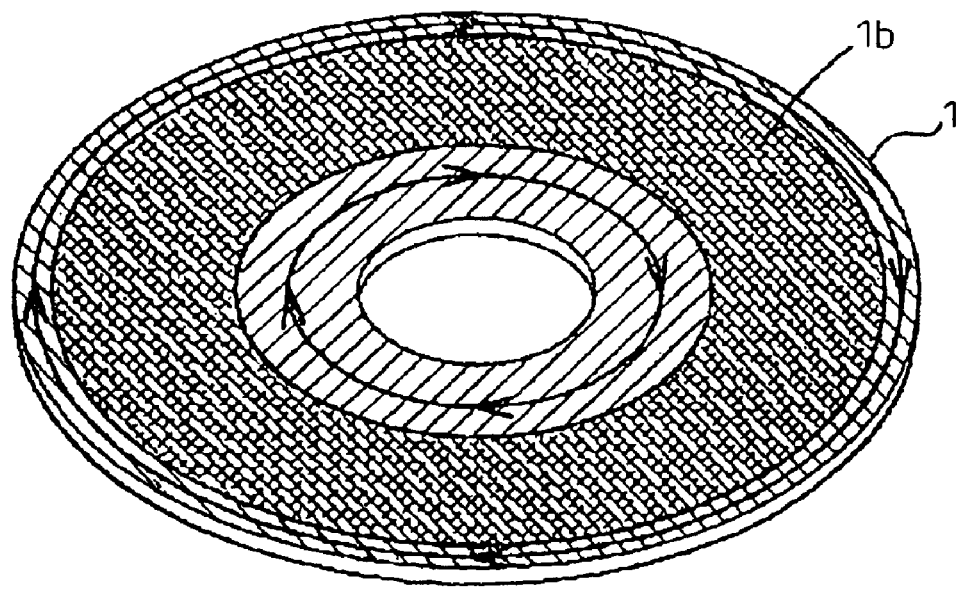
FIG. 10 is an illustration for showing magnetic transfer in the first embodiment of the invention.
Figure 11:
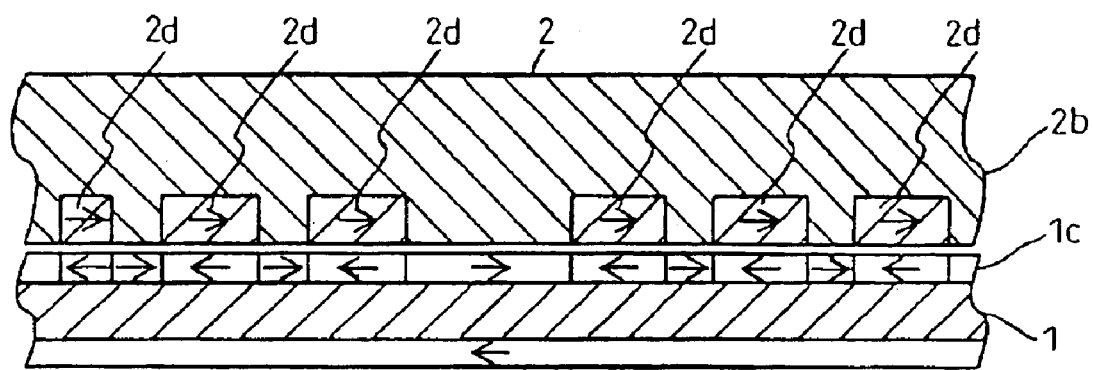
FIG. 11 is an illustration for showing a situation of magnetization processing in the first embodiment of the invention.

The following will further detail a procedure for transferring to the magnetic recording medium 1 an information signal that corresponds to a pattern shape formed on the master information carrier 2 with reference to FIGS. 9 to 11. First, by turning the magnet 17 as positioned near the magnetic recording medium 1 around the center axis of the magnetic recording medium 1 as a rotary axis in parallel therewith, the magnetic recording medium 1 is magnetized in one direction beforehand as shown by an arrow in FIG. 9 (initialization).

Figure 2:
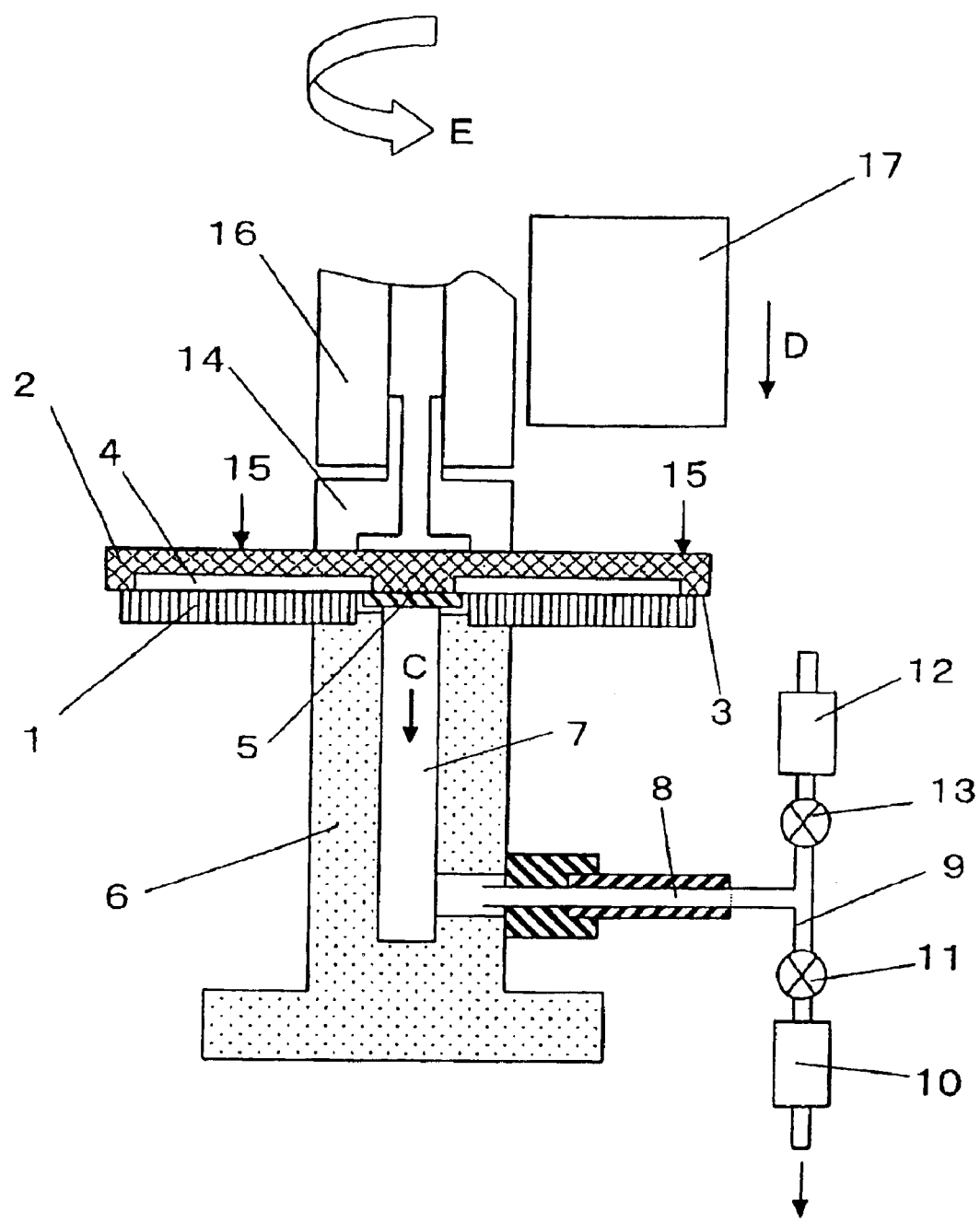
FIG. 2 is a cross-sectional view for showing a state where the master information carrier and the magnetic recording medium are in close contact with each other in the first embodiment of the invention.
Figure 3:
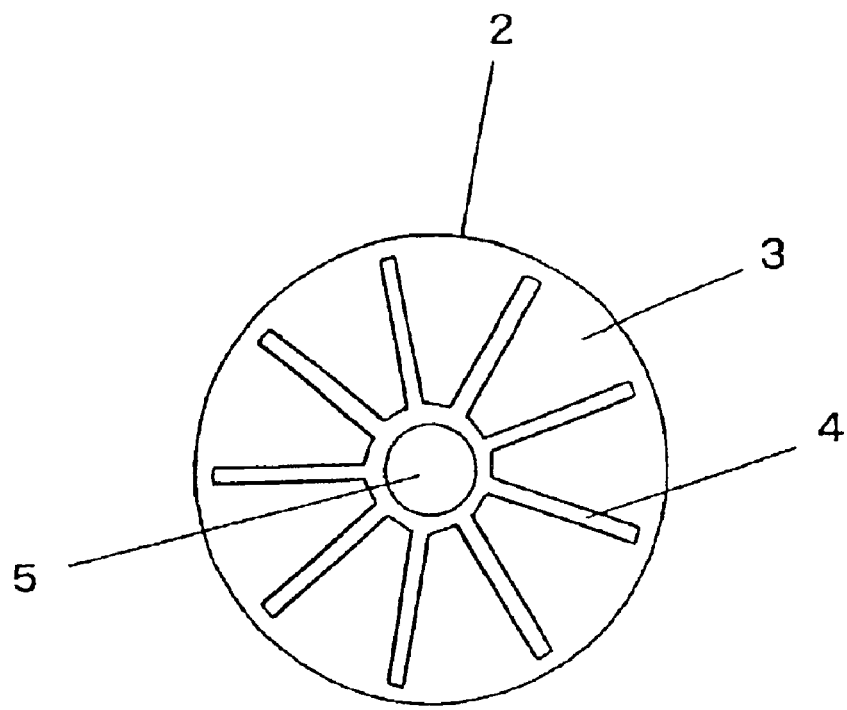
FIG. 3 is an illustration for showing a contact surface of the master information carrier on which it comes in contact with the magnetic recording medium in the first embodiment of the invention.

Next, as described above, the master information carrier 2 is aligned to the magnetic recording medium 1 and superposed thereon so as to be in close contact therewith and then, as shown by the arrow E in FIG. 2, by applying a magnetic field in a direction opposite to the initialization direction, the magnetic portion (ferromagnetic thin film) 2d of the master information carrier 2 is magnetized. Then, as shown in FIG. 10, an information signal that corresponds to a pattern shape of the magnetic portion 2d is recorded in a predetermined region 1b of the magnetic recording medium 1 as superposed on the master information carrier 2. Note here that the arrow shown in FIG. 10 indicates a direction of the magnetic field of a magnetization pattern recorded to the magnetic recording medium in a transfer manner.

This magnetization processing is shown in FIG. 11. As shown in it, the magnetic portion 2d is magnetized by applying an external magnetic field on the master information carrier 2 as brought in close contact with the magnetic recording medium 1. By doing so, the information signal can be recorded in a ferromagnetic layer 1c of the magnetic recording medium 1. That is, the master information carrier 2 is given by forming on the nonmagnetic base plate 2b the magnetic portion 2d made of a ferromagnetic thin film in an array pattern that corresponds to a predetermined information signal. A magnetization pattern corresponding to the information signal on this master information carrier 2 is magnetically recorded to the magnetic recording medium 1 in a transfer manner. Note here that the pattern of the master information carrier 2 may be recorded as transferred to the magnetic recording medium 1 by any other method, for example, by magnetizing the magnetic portion 2d of the master information carrier 2 beforehand and then bringing the master information carrier 2 as it is in close contact with the magnetic recording medium 1. By this method also, the information signal can be recorded as transferred.

Then, the separation operation shown in FIG. 1 is carried out again. That is, the exhaust valve 11 is closed and the air supply valve 13 is opened to operate the air supply pump 12. Then, as shown by the arrows A and B, air is supplied as compressed as shown by the arrows A and B, so that the master information carrier 2 moves integrally with the holding arm 14 and then stops when the upper surface of the holding arm 14 butts against the guide member 16. At this moment, as shown by the arrow B, air is held as compressed through the groove 4 from the center of the master information carrier 2 up to its outer periphery side in a radial manner.

If, in this state, there is an abnormal protrusion or a foreign matter on the contact surface 3 of the master information carrier 2, magnetization transfer, if carried out, produces a defect on the magnetic recording medium 1.

The following will describe a method for inspecting a defect on the master information carrier according to the embodiment of the invention with reference to FIGS. 12 to 20.

Figure 12:
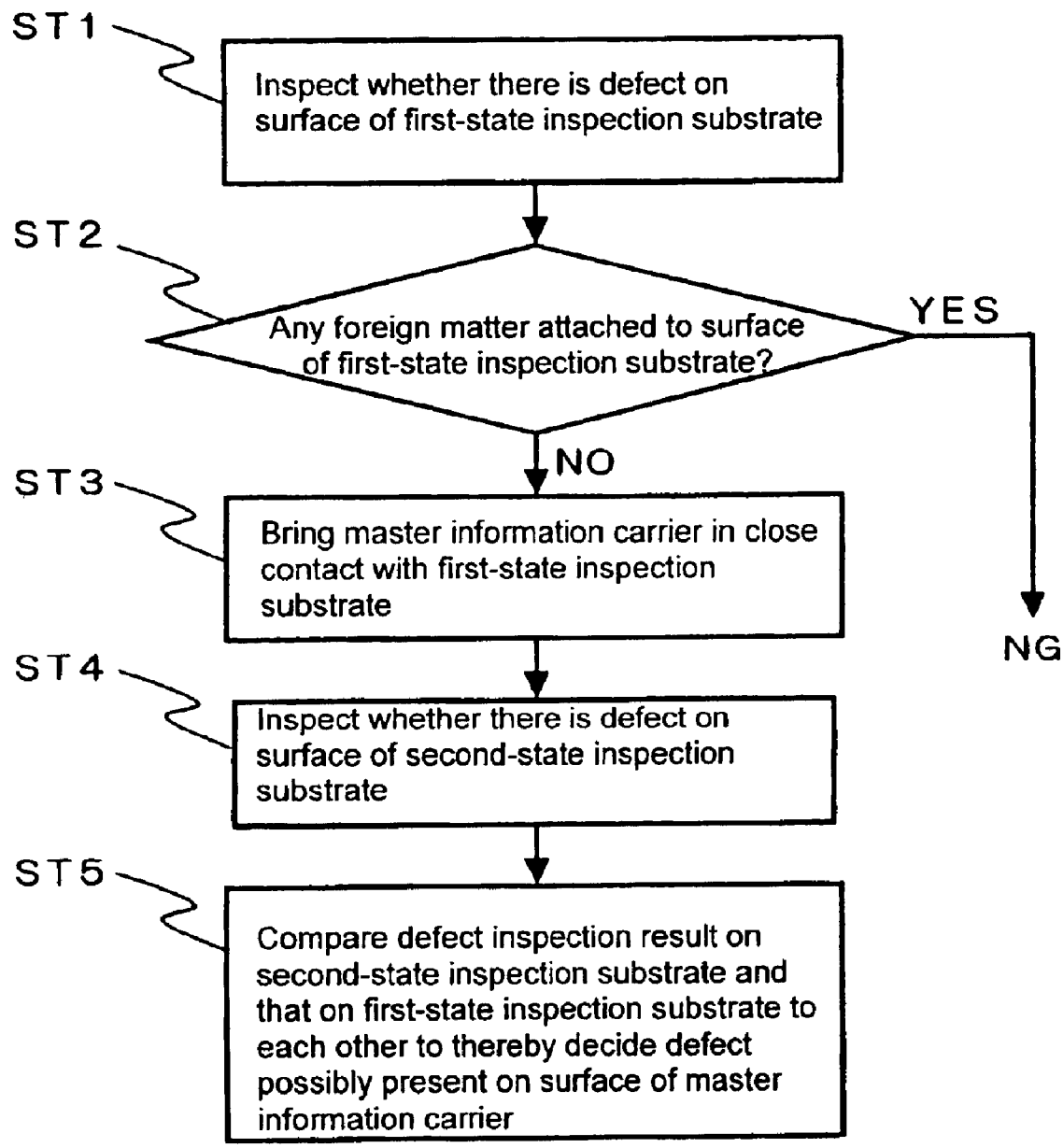
FIG. 12 is a flowchart for showing a defect inspection step in the first embodiment of the invention.

FIG. 12 shows a flowchart for showing a defect inspection method for a master information carrier according to this embodiment. First, steps ST1 and ST4 in FIG. 12 are described for inspecting a defect on the surface of a magnetic recording medium. Steps ST1 and ST4 use a publicly known defect inspecting apparatus. When a laser beam is applied to the surface of a disk, it gives rise to regularly reflected light or scattered light according to the shape, size, etc. of each defect. This light is received to detect the defect. The defect inspection apparatus used in this embodiment is simply outlined as follows.

Figure 13:
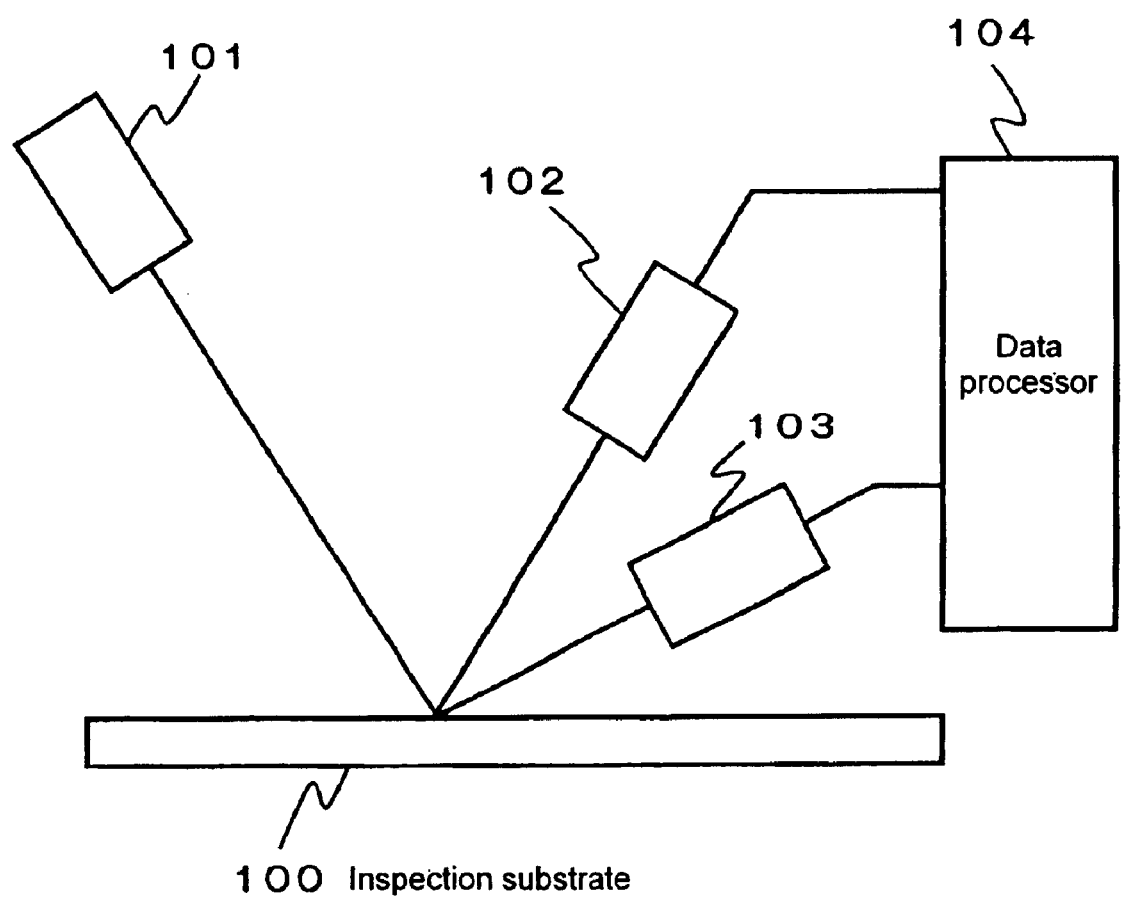
FIG. 13 is an illustration for showing a defect inspection apparatus in the first embodiment of the invention.

FIG. 13 shows the defect inspection apparatus used at steps ST1 and ST4 of FIG. 12. In FIG. 13, a reference numeral 100 indicates an inspection substrate which has formed on its aluminum-alloy base plate a NiP-plated layer to a thickness of about 10 μm for prevention of deformation, a reference numeral 101 indicates a laser beam emitter system, a reference numeral 102 indicates a regularly-reflected light reception system, a reference numeral 103 indicates a scattered-light reception system, and a reference numeral 104 indicates a data processor. A laser beam is emitted from the laser beam emitter system 101 to the surface of the inspection substrate in such a manner as to form a laser spot thereon. A rotary motor and a straight-line driver portion (not shown) for loading the inspection substrate 100 are operated simultaneously to thereby scan the laser spot in a spiral manner on the surface of the inspection substrate 100. If there is a defect on the surface of the inspection substrate 100, the laser spot is scattered, which is obtained by the scattered-light reception system 103 to thereby obtain a defect data signal. Regularly reflected light, on the other hand, is received by the regularly-reflected light reception system 102. These photo-reception system are thus provided so as to accommodate regularly reflected light and scattered light which are different in light intensity with different defect types. Also, optical elements such as a filter, lens, etc. are provided to receive light of interest (regularly reflected light and scattered light) efficiently. The light thus received by these photo-reception systems is converted into the corresponding defect data through a predetermined circuit and then input to the data processor 104.

The defect data signal thus obtained when each photo-reception system received the light is stored in a memory address that corresponds to a predetermined unit cell on the surface of the disk. The unit cell refers to a minute square having a disk radial minute distance $\Delta r$ and a disk circumferential minute distance $\Delta \theta$. For example, $\Delta r=10$ μm and $\Delta \theta=0.125°$.

If a defect such as an indentation, scratch, or particle having predetermined length and width is present over a plurality of consecutive unit regions, it is mistook to be a number of defects. As such, if any of a predetermined number of addresses adjacent an address in which defect data is stored, they are processed as consecutive addresses. The process decides the consecutiveness of each of the addresses and, if two addresses or more are consecutive, the process recognizes this groups of addresses to be one defect. Thus, the defects of any type are indicated in the number of groups regardless of their size and shape. A position coordinate of a defect is defined to be a gravity center of a groups of the addresses that are recognized to be consecutive.

Note here that the defect inspection apparatus has a function of returning to its home position when the inspection substrate 100 is loaded and unloaded. This operation is performed by a rotary motor (not shown) for scanning the inspection substrate 100 in a spiral manner.

First, at the step of ST1, the process inspects a defect possibly present on the inspection substrate 100 originally in the first state.

Next, at the step of ST2, the process confirms whether foreign matter is present on the surface of the inspection substrate 100 in the first state. Specifically, foreign matter is inspected on the first-state inspection substrate 100 using a publicly known optical defect inspection method. In this embodiment, such an optical inspection apparatus is used as to be different from but equivalent to the defect inspection apparatus used at ST1. The process sets a foreign matter detection slice level at 1 μm to thereby inspect whether foreign matter with a size of not smaller than 1 μm is attached to the surface of the inspection substrate. If, as a result of inspection, it detects foreign matter with a size of 1 μm or larger, the process decides the inspection substrate 100 to be NG (rejectable) and, otherwise, OK (acceptable). If it decides an inspection substrate to be rejectable, the process washes and recycles it. If decided to be even after recycled, the inspection substrate is disposed.

Thus, the first-state inspection substrate 100 can be inspected for foreign matter possibly present thereon prior to close contacting at ST3, thus preventing the foreign matter on the surface of the fist-state inspection substrate 100 from being attached to the master information carrier 2 to damage it.

At ST2 also, the defect inspection apparatus returns to its home position like in the case of ST1.

At the step of ST3, the master information carrier 2 and the first-state inspection substrate 100 as finished with defect inspection are brought in close contact with each other almost in the same way as described with reference to FIGS. 1 and 2. That is, the contents are the same with an exception that the magnetic recording medium 1 shown in FIGS. 1 and 2 is replaced by the inspection substrate 100 in the first state.

Then, at the step of ST4, the process inspects whether a defect is present on the surface of the inspection substrate 100 in the second state. At step ST4, specifically the process inspects whether a defect is produced on the inspection substrate 100 after the master information carrier 2 is brought in close contact with the first-state inspection substrate 100. The second-state inspection substrate has a defect on the master information carrier 2 transferred thereto as a result of close contacting.

Figure 14:
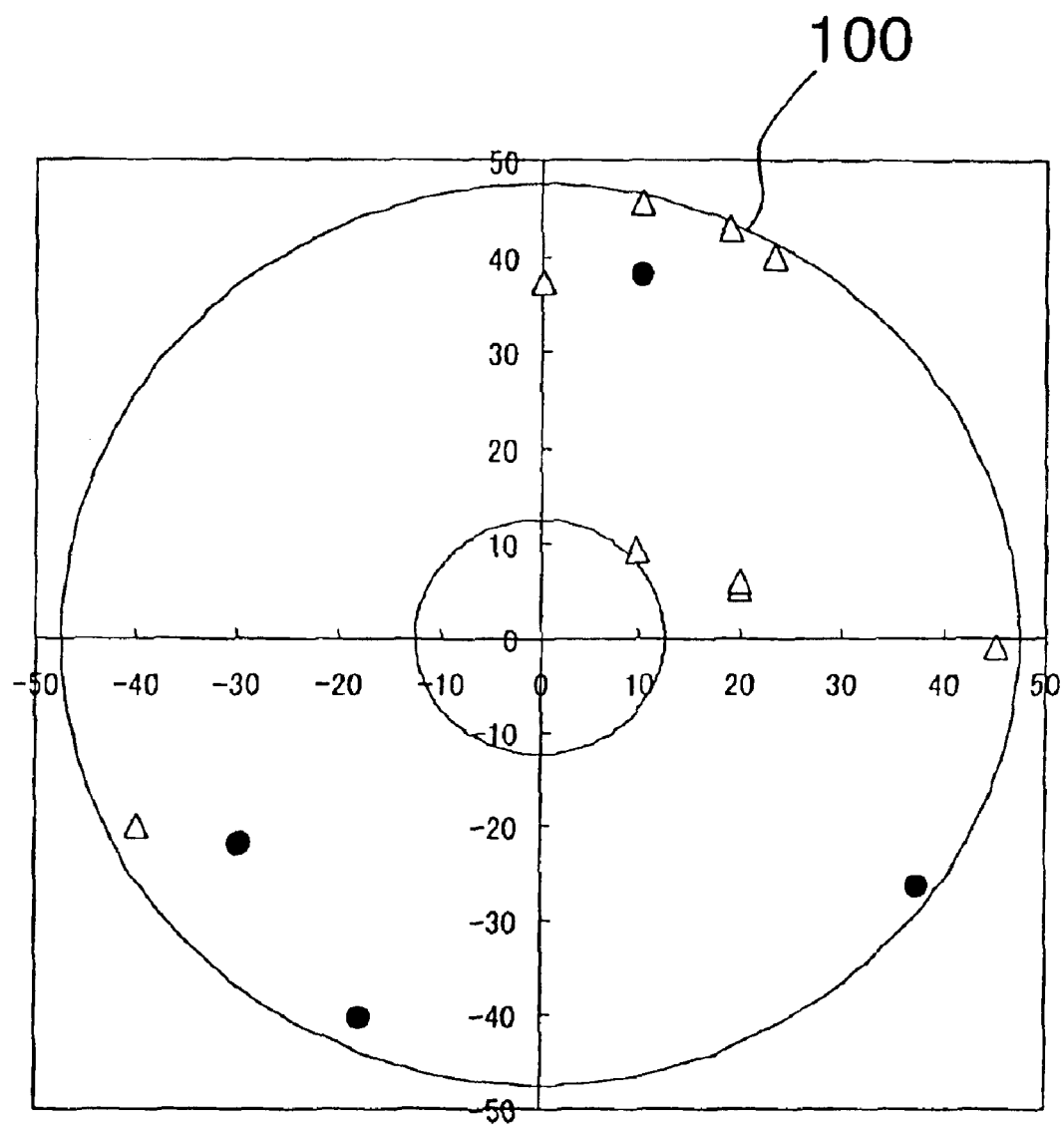
FIG. 14 is an illustration for showing a result of defect inspection performed at step ST1 in the first embodiment of the invention.
Figure 15:
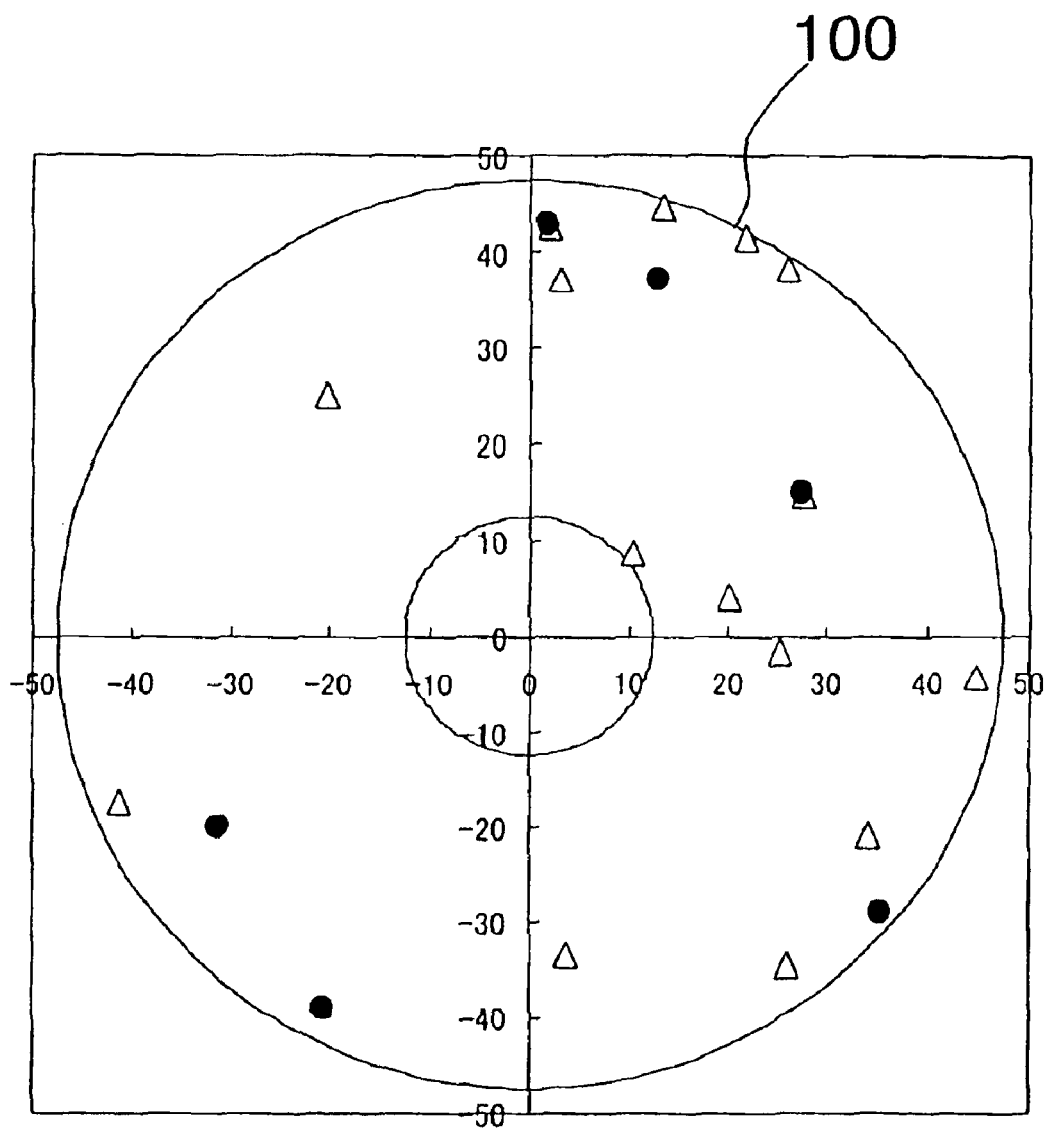
FIG. 15 is an illustration for showing a result of defect inspection performed at step ST4 in the first embodiment of the invention.

FIG. 14 shows a result of defect inspection performed on the first-state inspection substrate 100 at step ST1 and FIG. 15 shows a result of defect inspection performed on the second-state inspection substrate 100 at step ST4. In FIGS. 14 and 15, a solid circle (●) indicates a center position of a defect optically recognized by a photo-receptor element of the regularly-reflected light reception system 102 and a triangle (Δ) indicates that optically recognized by a photo-receptor element of the scattered-light reception system 103.

Figure 16:
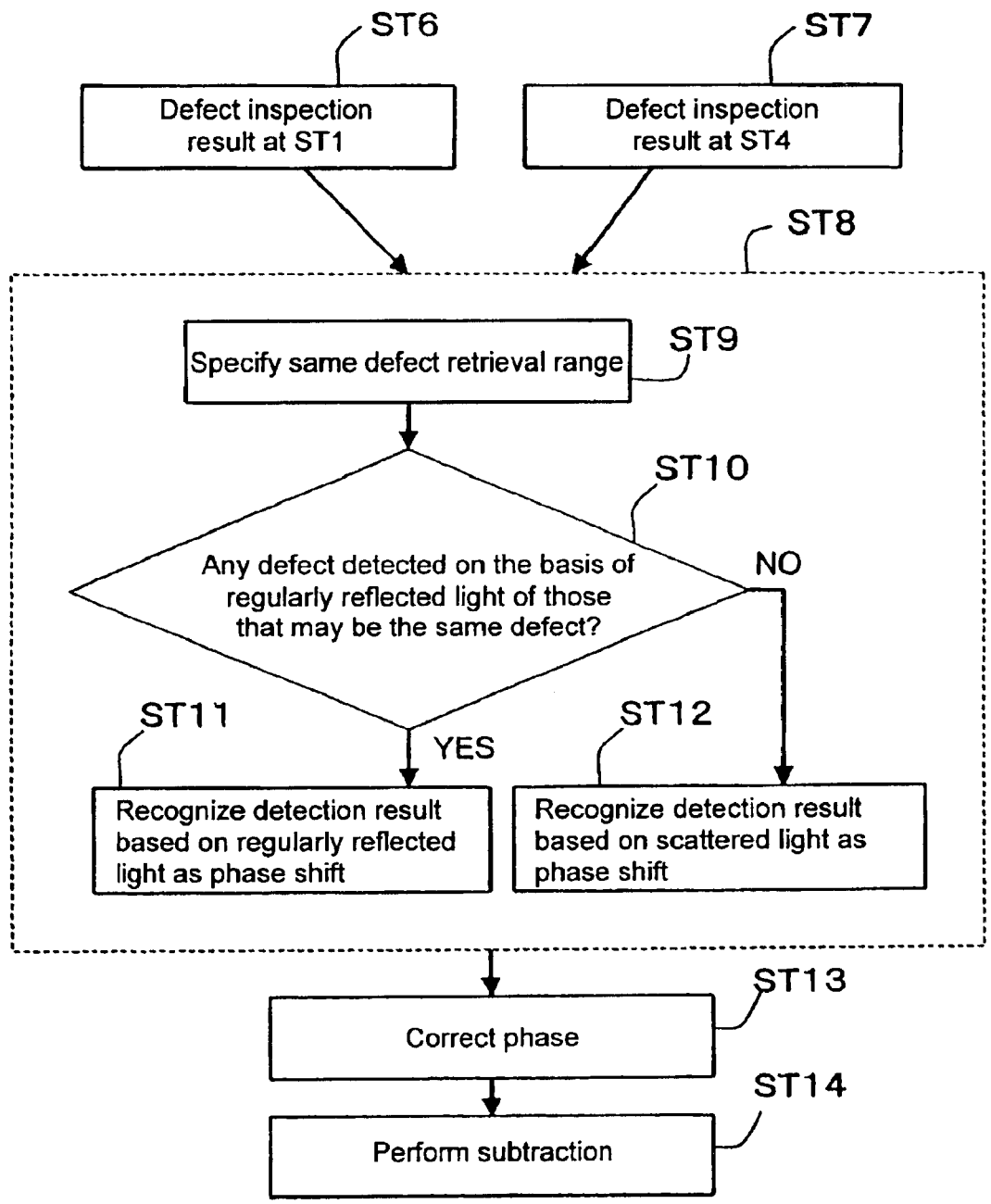
FIG. 16 is a flowchart for showing a step of deciding a defect caused by a master information carrier in the first embodiment of the invention.
Figure 17A:
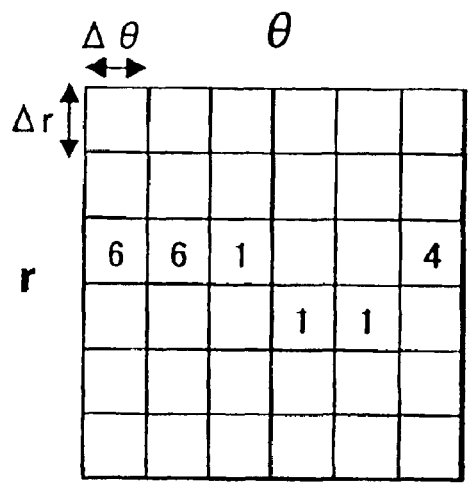
FIGS. 17 are graphs for showing a position of a gravity center of a variety of types of defects detected by measurement performed 20 time consecutively on the same inspection substrate in the first embodiment of the invention.
Figure 17B:
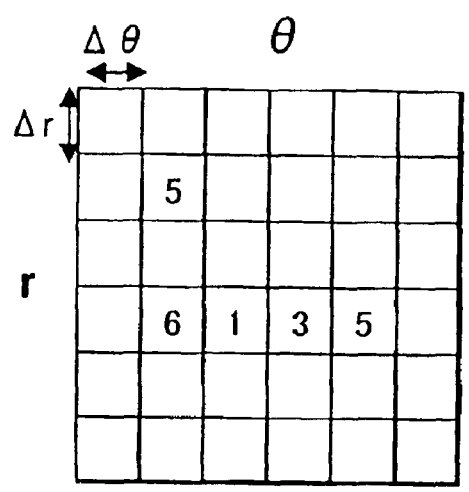
Figure 17C:
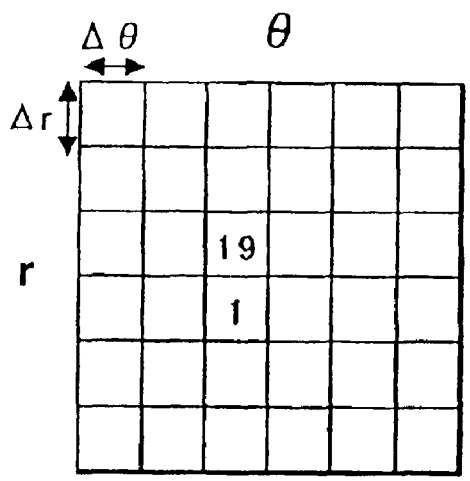
Figure 17D:
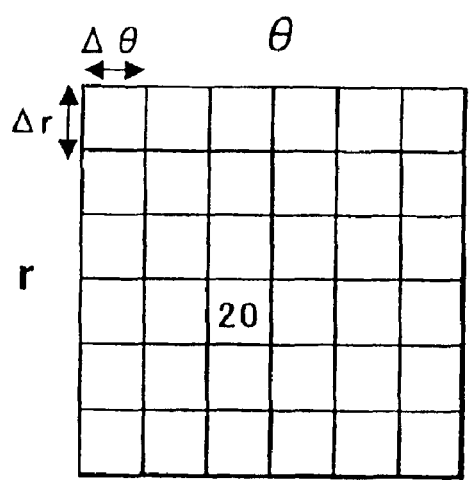

The following will describe a step of ST5 of FIG. 12 for deciding a defect caused by the master information carrier 2 with reference to FIG. 16. FIG. 16 is a flowchart for showing the step of ST5. In FIG. 16, ST6 and ST7 indicates a defect inspection result at steps ST1 and ST4 and correspond to FIGS. 14 and 15 respectively in this embodiment. At ST8, the process detects a shift in turned phase of the inspection substrate in the defect inspection result at the steps ST1 and ST4. First, as shown at ST9, the process specifies a range within which the turned phase and the position may shift of the first-state and second-state inspection substrates 100 when they were inspected for a defect thereon at ST1 and ST4 respectively. In this embodiment, the rotary motor is provided with the home-position returning function to avoid a large shift in turned phase of the magnetic recording medium at steps ST1, ST2, and ST4. Also, the first-state inspection substrate 100 is not turned at the close contacting step of ST3, so that the disk is not shifted largely in turned phase. The turned phase, however, may be shifted to some extent owing to conveyance of the inspection substrate 100 or its fluctuations etc. in returning to the home position. To guard against this, preferably an upper fluctuation limit is specified for ranges of a shift in turned phase and position. In this embodiment, the ranges of a shift in the turned phase and the position are set at 10 degrees and 0.5 mm respectively.

Next, a step of ST10 is performed. That is, the process compares a defect inspection result of ST1 sent from ST6 and that of ST4 sent from ST7 to each other to thereby enumerate defects of each type that have a turned phase shift of 10 degrees or less and a position shift of 0.5 mm or less. From among them such defects are decided as to have been detected by the photo-receptor element of the regularly-reflected light reception system 102. If such defects are found, as described with the step of ST11, the process decides a phase shift amount between these defects to be a shift amount between the first-state inspection substrate 100 at the step of ST1 and the second-state inspection substrate at the step of ST4. If there is no defect detected by the regularly-reflected light receptor element R, as described with the step of ST12, the process recognizes a scattered-light detection result as a phase shift. Therefore, preferably priority is given to a result detected with regularly reflected light over a result detected with scatted light when these results are used to correct a turned phase of the defect. The reasons for this are described with reference to FIG. 17.

FIGS. 17 are graphs for showing a result of defect measurement performed by the defect inspection apparatus on the inspection substrates used at steps ST1 and ST2, that is, a result of the gravity (center) position of each type of defect obtained by returning the apparatus to its home position for each of the measurement operation performed 20 times consecutively on the same inspection substrate without dismounting the rotary motor. FIGS. 17A and 17B indicate the measurement result of foreign matter, that is, a defect detected by the photo-receptor element of the scattered light reception system 103 and FIGS. 17C and 17D, that of a recess, that is, a defect detected by the photo-receptor element of the regularly-reflected light reception system 102. Also, in the figures, the vertical axis indicates a value r in the radial direction f the inspection substrate 100 and the horizontal axis, a value .theta. in the circumferential direction thereof. The unit cell of the defect inspection apparatus used in this embodiment has Δr=10 μm and Δθ=0.125°. A numeral in the cell indicates the number of times the center of a defect is detected therein. As is clear from the measurement results of these figures, fluctuations in FIGS. 17A and 17B, that is, those in the position of defects detected by the photo-receptor element of the scattered light reception system 103 are larger than those in FIGS. 17C and 17D, that is, those detected by the photo-receptor element of the regularly-reflected light reception system 102. This is because the photo-receptor element of the scattered light reception system 103 detects a portion of light that is scattered from a laser spot, so that even with the same defect detected, it is more liable to recognize a shift in position of the detected portion caused by a subtly shifted position or angle of laser beam application than by the photo-receptor element of the regularly-reflected light reception system. Therefore, preferably priority is given to a result detected by the regularly-reflected light receptor element over that by the scattered light receptor element for use in correction of a turned phase.

As is clear from the above, priority is given to the result detected by the regularly-reflected light receptor element over that by the other, thus making it possible to improve the accuracy of defect inspection.

FIG. 18 shows a result of comparing a defect inspection result of ST1 and that of ST4 to each other to thereby enumerate defects with a turned phase shift amount of 10 degrees or less and a position shift amount of 0.5 mm or less of those detected by the regularly-reflected light receptor element.

In FIG. 18, ΔR indicates a radial difference between the defect inspection result of ST1 and that of ST4 and Δθ indicates a circumferential difference between them. As shown in FIG. 18, it is found that a turned phase shift of the inspection substrate at the time of defect inspection is 4.125 degrees based on the defect inspection results of the steps of ST1 and ST4. This finding is given by majority decision. If the same data exists over a plurality of cases, their values are averaged.

Next, a step of phase correction of ST13 shown in FIG. 16 is performed. As shown in FIG. 18, the phase shift as measured in defect inspection between the phase values of the steps ST1 and ST4 is 4.125 degrees. Based on this result, the defect inspection resultant data of the step ST1 is turned by 4.125 degrees in such a direction as to correct the phase shift, that is, clockwise in FIG. 14.

Next, subtraction processing is performed at ST14 in FIG. 16. The subtraction processing is typically performed in comparison between a defect inspection result of the second-state inspection substrate 100 and that of the first-state inspection substrate 100.

By the step of ST13, the defect inspection result of ST4 is subtracted by that of ST1 after phase correction is performed at ST1 and ST4. That is, the process calculates [defect inspection result of ST4]–[defect inspection result of ST1].

In subtraction, it is necessary to set a range in which similar defects are considered to be the same; in this embodiment, specifically taking fluctuations in position into account, any defects of the same type that have a radial difference r of 0.05 mm or less and a circumferential difference θ is 1 degree or less are considered to be the same. This result of subtraction is shown in FIG. 19.

Figure 19:
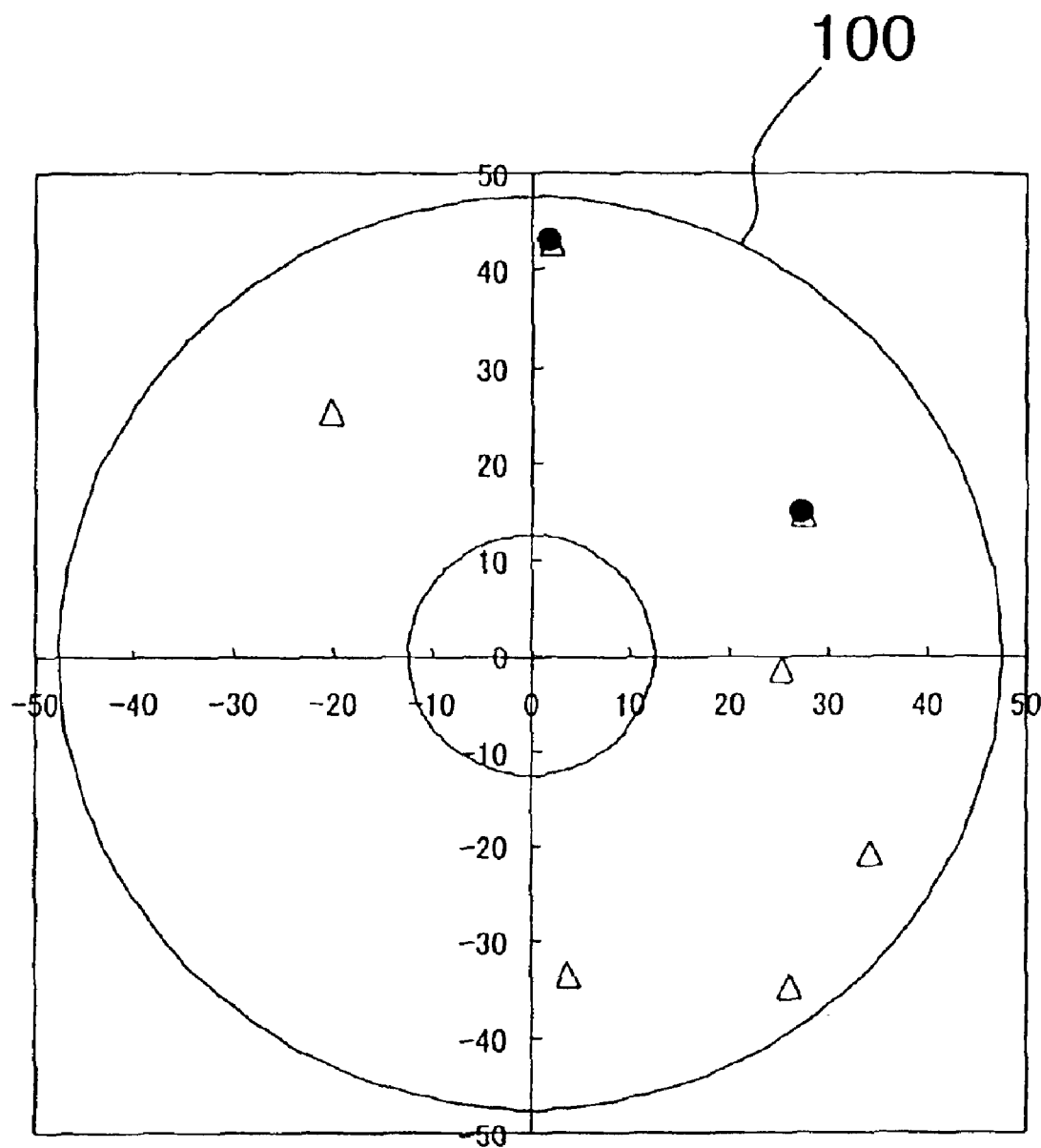
FIG. 19 is an illustration for showing a result of subtraction performed in the first embodiment of the invention.

FIG. 19 gives data indicating defects as a result of subtraction performed at ST14 by the above-mentioned method.

As shown in FIG. 19, two defects were detected by the photo-receptor element of the regularly-reflected light reception system 102 and seven defects were detected by the photo-receptor element of the scattered light reception system 103.

Observation of these defects by a microscope confirmed that the defects detected y the photo-receptor element of the regularly-reflected light reception system 102 were an abnormal protrusion present on the surface of the master information carrier 2. Also, the defects detected by the photo-receptor element of the scattered light reception system 103 were a minute particle attached to the surface of the master information carrier.

In this case, preferably the inspection substrate 100 has no lubricant applied thereon. If lubricant is applied like in the case of an ordinary magnetic recording medium, the foreign-matter absorbance is deteriorated, thus making it possible to attach foreign matter to the side of the inspection substrate 100. It leads to a deterioration of the accuracy of defect inspection. To avoid such accuracy deterioration for more accurate defect inspection, no lubricant is applied in this embodiment.

Like in this embodiment, by using such an inspection substrate that its lubricant-free surface provides a NiP-plated layer, foreign matter attached to the master information carrier can be transferred and attached to the inspection substrate securely.

Also, preferably the inspection substrate 100 has a lower hardness than the master information carrier 2. If the surface of the inspection substrate 100 is harder than the master information carrier 2, the following trouble will occur. If an abnormal protrusion or foreign matter is present that is harder than the surface of the master information carrier 2 but lower than the inspection substrate 100, the inspection substrate 100 has no indentation in its surface. When, conversely, the surface of the inspection substrate 100 is made less harder than the master information carrier 2, the inspection substrate 100 can surely have an indentation formed therein, thus making it possible to securely detect the abnormal protrusion or foreign matter present on the master information carrier 2.

Also, although this embodiment has employed such a configuration that the inspection substrate 100 is comprised of an aluminum base and a NiP-plated layer applied thereon, the invention is not limited thereto. For example, it may be replaced with Co—Re—P, Co—Ni—P, or Co—Ni—Re, which have magnetic properties. By applying a plated layer with magnetic properties, the following effects can be obtained. That is, if an abnormal protrusion exists on the magnetic film present on the surface of the master information carrier 2, the magnetic film may be peeled off from the surface of the master information carrier 2 by the close contacting/separation operation. If the inspection substrate 100 has a plated layer having magnetic properties applied on its surface, the above-mentioned peeled-off magnetic layer can be absorbed magnetically to the side of the inspection substrate 100 securely, thus preventing the surface of the master information carrier 2 from being contaminated by the magnetic film peeled off.

The above-mentioned method employed makes it possible to detect exactly and at a high sensitivity an abnormal protrusion or foreign matter present on the surface of the master information carrier.

Figure 20:
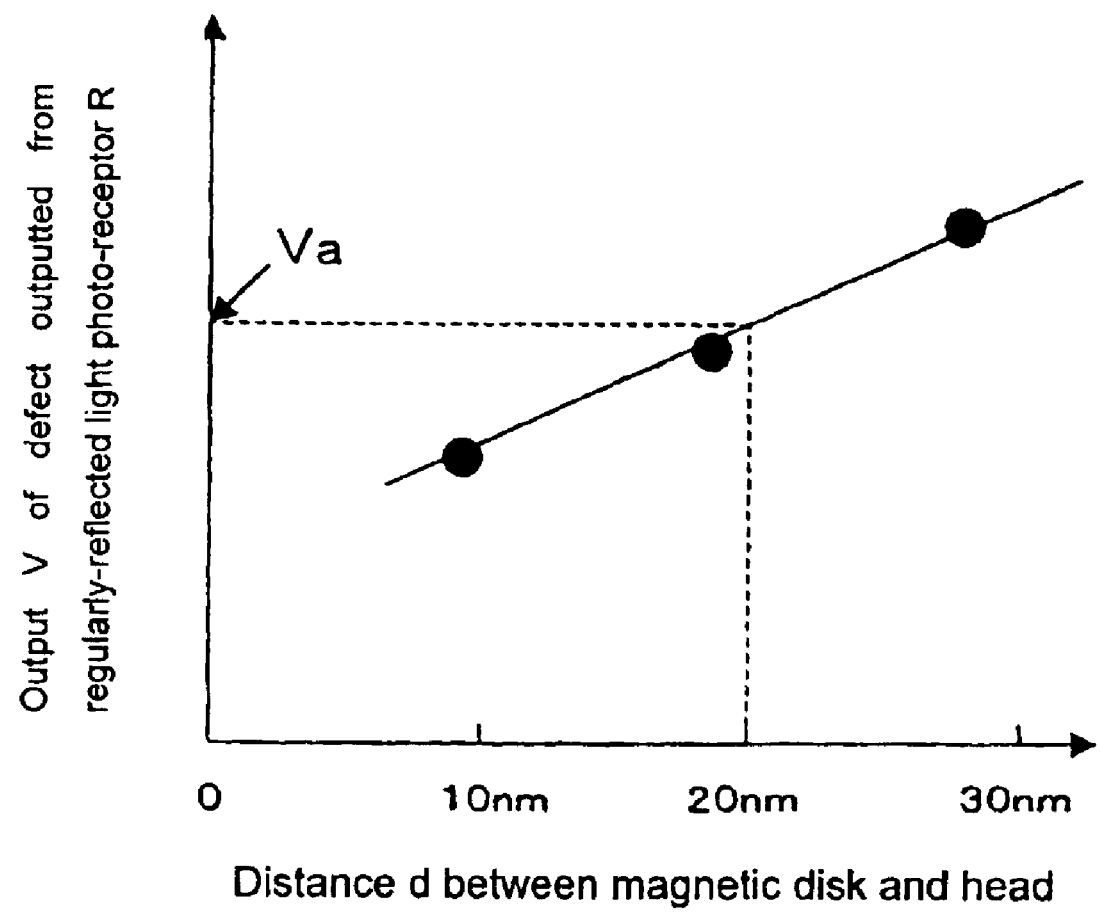
FIG. 20 is a graph for showing a relationship between an output of a defect in an indentation detected by the photo-receptor element in the regularly reflected light reception system and a distance between a magnetic recording medium and a head.

FIG. 20 shows a relationship between a distance d between a magnetic recording medium and a head and an output V of a detected defect. The inspected-defect output V refers to an output from an indentation detected by the photo-receptor element of the regularly-reflected light reception system 102. The distance d refers to a distance at which an AE sensor attached to the head senses a relevant defect first when a float amount of the head is gradually lowered over the position of the defect in a publicly known Glideheit test.

As can be seen from FIG. 20, there is a correlation between the output of a defect detected by the photo-receptor element of the regularly-reflected light reception system 102 and a distance between the magnetic recording medium and the head. Here, suppose that a float distance between the magnetic recording medium and the magnetic head of a magnetic recording/reproducing apparatus to be 20 nm. When a threshold level of the output of a defect detected by the photo-receptor element is set at a predetermined value lower than Va in FIG. 20, a carrier under test is decided to be acceptable if no detect is detected by the photo-receptor element of the regularly-reflected light reception system 102 at the step of ST5 and, if at least one defect is detected, decided to be rejectable. If the relevant carrier is detected to be rejectable, a defect responsible for the rejection must be an abnormal protrusion or attached foreign matter on the master information carrier 2, so that the same defect may occur in all of the magnetic recording media after magnetic transfer is performed. Therefore, it is necessary to observe the defect on the surface of a master information carrier 2 corresponding to the defect position to then reject it. If no defect is detected by the photo-receptor element of the regularly-reflected light reception system 2 at ST5, a master information carrier 2 decided to be acceptable is used in magnetic transferring, to then mount the magnetic recording medium 1 finished with magnetic transfer to the drive of the magnetic recording/reproducing apparatus.

The above-mentioned method makes it possible to securely detect a defect ascribed to the master information carrier, thus providing a magnetic recording/reproducing apparatus with a high responsibility.

Second Embodiment

The following will describe a method for detecting a defect on a master information carrier according to the second embodiment of the invention with reference to FIGS. 21 to 25.

The second embodiment is different from the first embodiment in that the region on the master information carrier 2 when it is brought in close contact with the inspection substrate 100 completely includes a magnetic transfer region where magnetic transfer is performed to a regular magnetic recording medium 1.

Figure 21A:
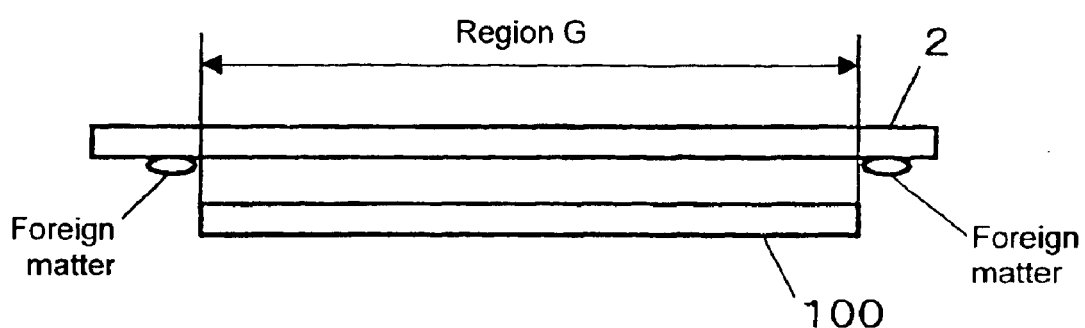
FIG. 21 are illustrations for schematically showing a relationship in a close contact state between the master information carrier and the inspection substrate in a second embodiment of the invention.
Figure 21B:
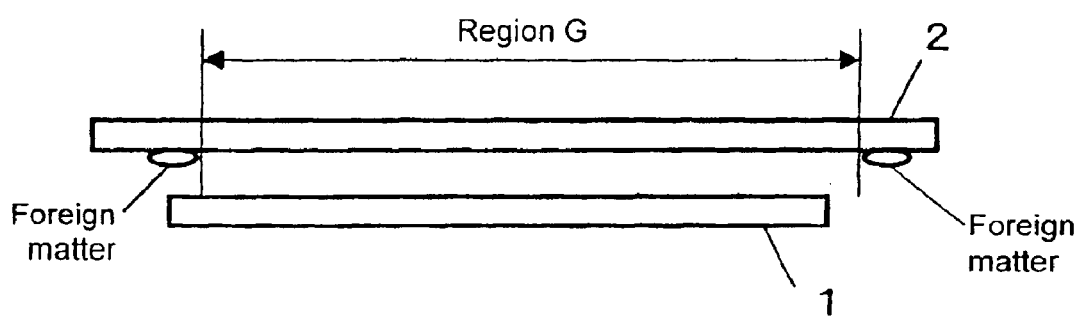

FIG. 21 are illustrations for addressing a problem that provides a premise for a suggestion of the second embodiment. That is, these figures explain a disadvantage of using the same size of the inspection substrate 100 as that of the magnetic recording medium 1. FIGS. 21A and 21B schematically show a relationship at the time of inhaling/compression between the master information carrier 2 and the inspection substrate 100.

In FIG. 20A, the inside of a region G is inspected when the master information carrier 2 and the first-state inspection substrate 100 are in close contact with each other. As such, foreign matter, if any, outside the region G is not detected. The region G corresponds to an external profile of the magnetic recording medium 1. The foreign matter is attached to a very thin annular region between the maximum region of the surface directional position shift and the magnetic recording medium's external profile, that is, in the extremely thin annular region but not transferred to the first-state inspection substrate 100 because it is outside the region G.

Next, when the first-state inspection substrate 100 is replaced with the regular magnetic recording medium 1 to then undergo magnetic transfer, if they are of the same size, as shown in FIG. 21B, a shift in the mounting position causes a portion with the foreign matter outside the inspection range to come in contact with the magnetic recording medium 1, so that an edge of the magnetic recording medium 1 may abut the foreign matter in some cases. In such a case, the vicinity of the foreign matter suffers from deterioration in the close contacting degree between the magnetic recording medium 1 and the master information carrier 2, thus decreasing the output of the information signal transferred to the magnetic recording medium 1. As a result, a read-out error occurs, thus disturbing the turning of the magnetic recording medium 1.

To guard against this, a larger inspection substrate 100 than the regular magnetic recording medium 1 is used to thereby widen the region G in FIG. 21A. This makes it possible to securely transfer foreign matter attached to the extremely thin annular region of the master information carrier to the inspection substrate 100. That is, defect inspection can be performed securely on the master information carrier 2. Then, the foreign matter-free master information carrier 2 decided to be normal can be used to magnetically transfer the information signal to the magnetic recording medium 1, thus performing normal magnetic transfer throughout the surface of the magnetic recording medium. It is thus possible to manufacture a high-quality magnetic recording medium free of a decrease in output of the information signal. As such, it is necessary to bring the master information carrier 2 and the inspection substrate 100 in close contact with each other only once.

By the way, as the inspection substrate 100, typically a regular magnetic recording medium in process of manufacture, for example, a disk having as its base plate such an aluminum alloy as referred to in the description of the first embodiment is used in many times. By using in a diverted manner such a semi-finished product of the magnetic recording medium in place of a particular inspection substrate, the costs can be reduced. In such a case, however, the inspection substrate 100 is sized the same as the master information carrier 2. As such, to obtain the above-mentioned effects, such a method might well be employed as to decentralize the inspection substrate 100 when the inspection substrate 100 and the master information carrier 2 are brought in close contact with each other.

Figure 22:
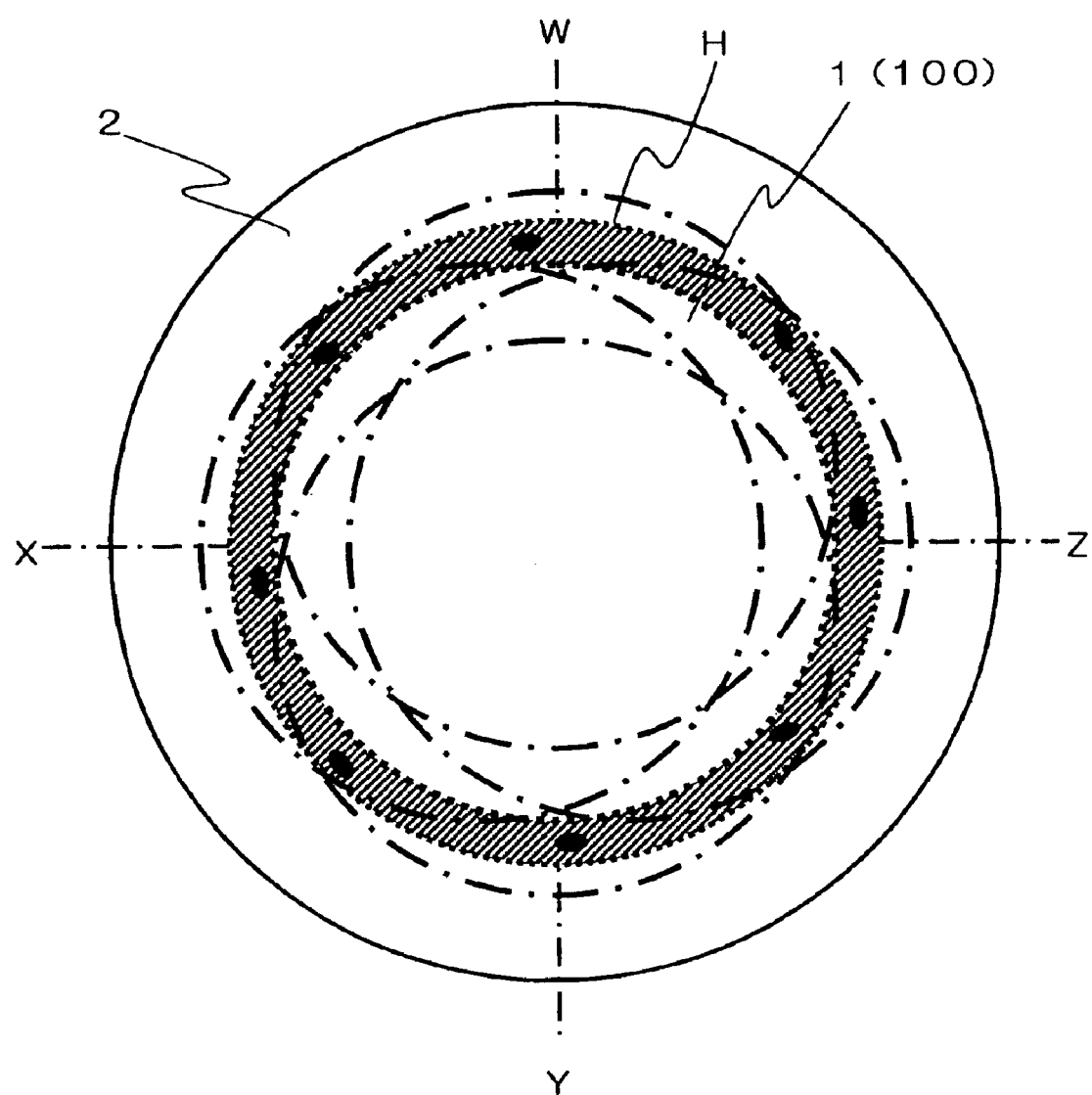
FIG. 22 is an illustration for showing a close-contacting position of the inspection substrate with respect to the master information carrier in the second embodiment of the invention.

That is, as shown in FIG. 22, the close-contacting/separation operation is performed a few times, so that each time they are brought in close contact with each other, the first-state inspection substrate 100 is shifted sequentially to close-contacting positions W, X, Y, and Z in this order with respect to the master information carrier 2, thus making it possible to conduct inspection on the region completely including the regular magnetic recording medium 1. Also, this method makes it possible to further improve the inspection accuracy. The contents are described with reference to FIGS. 23 to 25.

Figure 23:
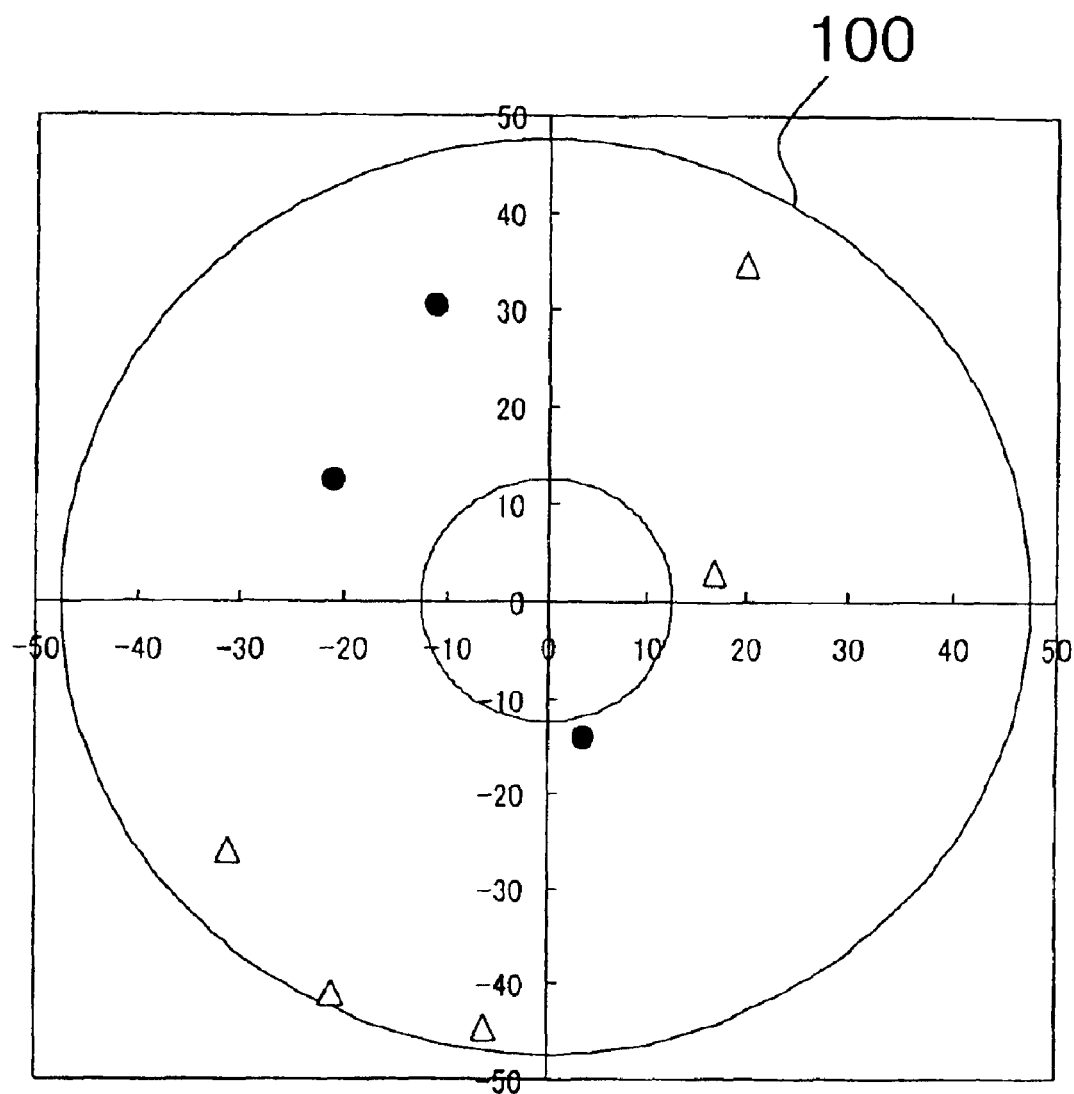
FIG. 23 is an illustration for showing a result of defect inspection performed at step ST1 in the second embodiment of the invention.
Figure 24:
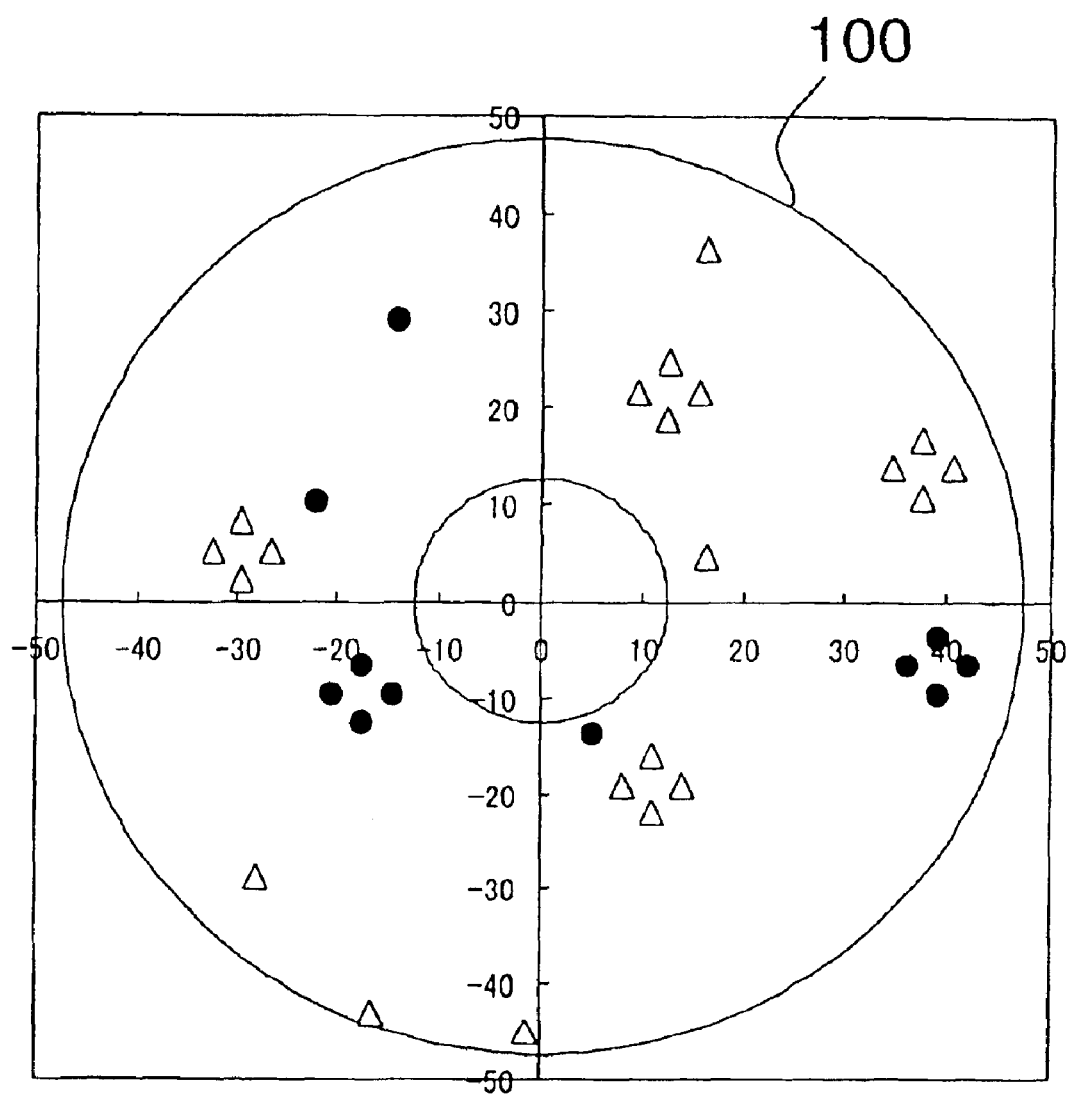
FIG. 24 is an illustration for showing a result of defect inspection performed at step ST4 in the second embodiment of the invention.
Figure 25:
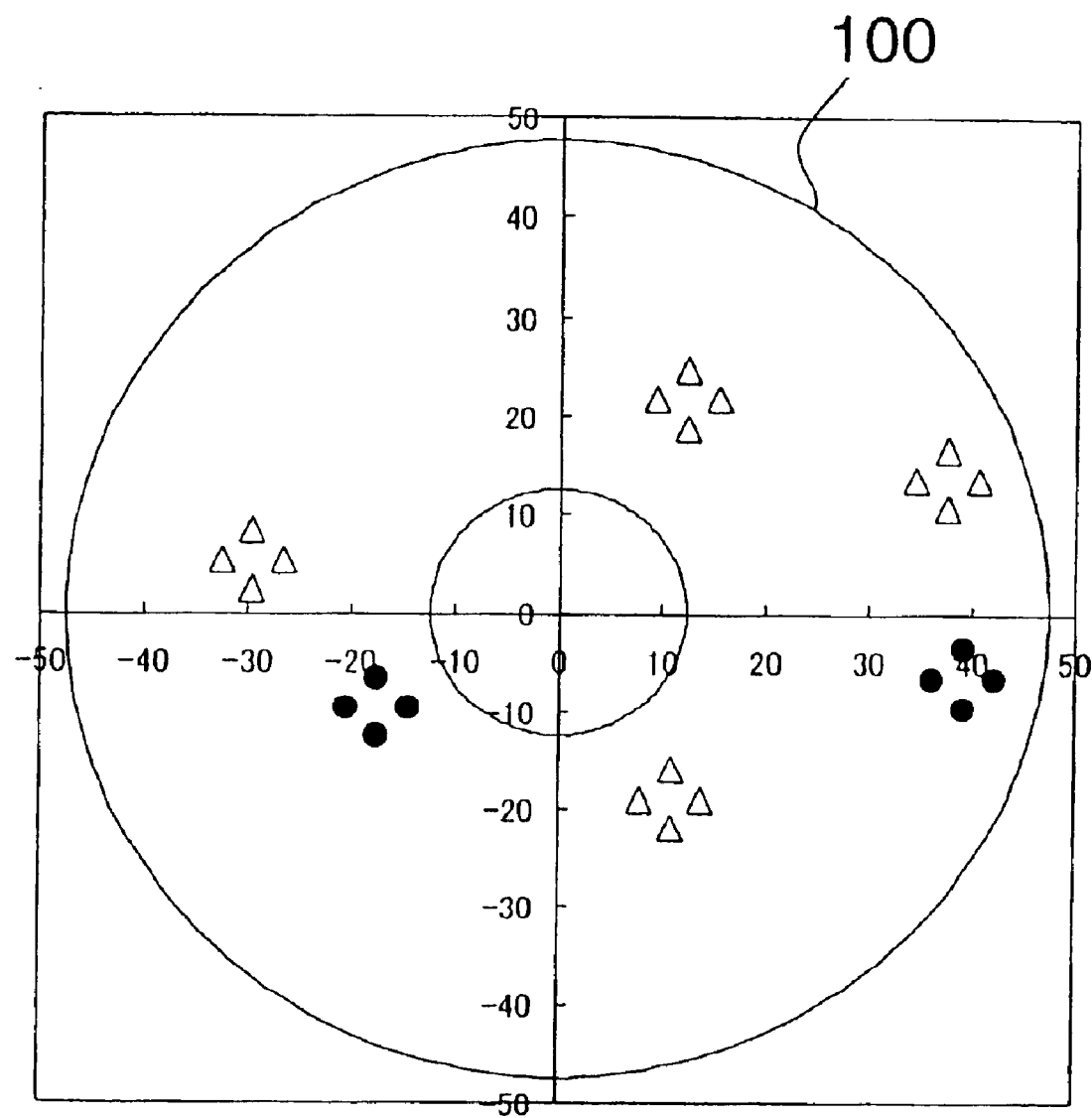
FIG. 25 is an illustration for showing a result of subtraction performed in the second embodiment of the invention.

FIGS. 23 to 25 show a result of defect inspection performed according to the second embodiment.

FIG. 23 shoes a result of inspecting a defect on the surface of the first-state inspection substrate 100, that is, a result of defect inspection performed at step ST1 in FIG. 12.

At step ST2 following ST1, the process inspects, using the defect inspection apparatus, whether there is foreign matter sized 1 $\mu$m or larger on the surface of the first-state inspection substrate 100 and, if no defect is detected, goes to the close-contacting step of ST3. At the step of ST3, a driver portion (not shown) is utilized to dispose the first-state inspection substrate 100 at the positions W, X, Y, and Z shown in FIG. 22 with respect to the guide member 16 shown in FIG. 2. First, in a state where the master information carrier 2 and the first-state inspection substrate 100 are separated from each other as shown in FIG. 1, the driver portion is used to move the guide member 16 in such a manner that the first-state inspection substrate 100 may be disposed at the position W shown in FIG. 22. Then, they are brought in close contact with each other as shown in FIG. 2 to separate them again as shown in FIG. 1. Similarly, the driver portion is used to move the guide member 16 so that the first-state inspection substrate 100 may be disposed to the position X shown in FIG. 22 to then undergo the close contacting/separation operation, which is repeated at the positions Y and Z finally. The inspection substrate which has thus undergone the close contacting/separation operation provides the second-state inspection substrate.

This method makes it possible to bring the first-state inspection substrate 100 in close contact with the master information carrier 2 over the range including the close-contacting region of the magnetic recording medium 1. That is, it is possible to perform inspection all over a possibility region H where foreign matter which exists outside the region corresponding to the magnetic recording medium on the master information carrier 2 owing to a shift in position with respect to the magnetic recording medium 1 may butt against the magnetic recording medium 1. In FIG. 22, the possibility region H is concentric with the magnetic recording medium 1. A region where foreign matter indicated by a solid circle is scattered is the extremely thin annular region (see a hatched portion).

Next, the process performs the step of ST4 for inspecting a defect on the surface of the second-state inspection substrate 100. The result is shown in FIG. 24.

Next, the process performs the step of ST5 for inspecting a defect ascribed to the master information carrier 2. The result is shown in FIG. 25. As is clear from it, the process performs defect inspection four times each at each of different positions where the master information carrier 2 is brought in close contact with the first-state inspection substrate 100, thus detecting the inspection substrate 100 a plurality of times for any defect caused by an abnormal protrusion or foreign matter on the surface of the master information carrier 2. It is thus possible to securely transfer even a defect possibly present on the extremely thin annular region to the inspection substrate 100, thus preventing a mistake in inspection completely. Note here that the number of times of close contacting at different positions is not limited to four for each turning angle of 90 degrees as described above. For example, a defect may be inspected eight times for each turning angle of 45 degrees or three times for each turning angle of 120 degrees.

It is thus possible to securely detect a defect ascribed to the master information carrier by using the above-mentioned method, thus providing a defect inspection method and magnetic recording/reproducing apparatus having a high reliability.

Third Embodiment

The following will describe a method of inspecting a defect on a magnetic recording medium according to the third embodiment of the invention with reference to FIGS. 26 to 30.

Figure 26:
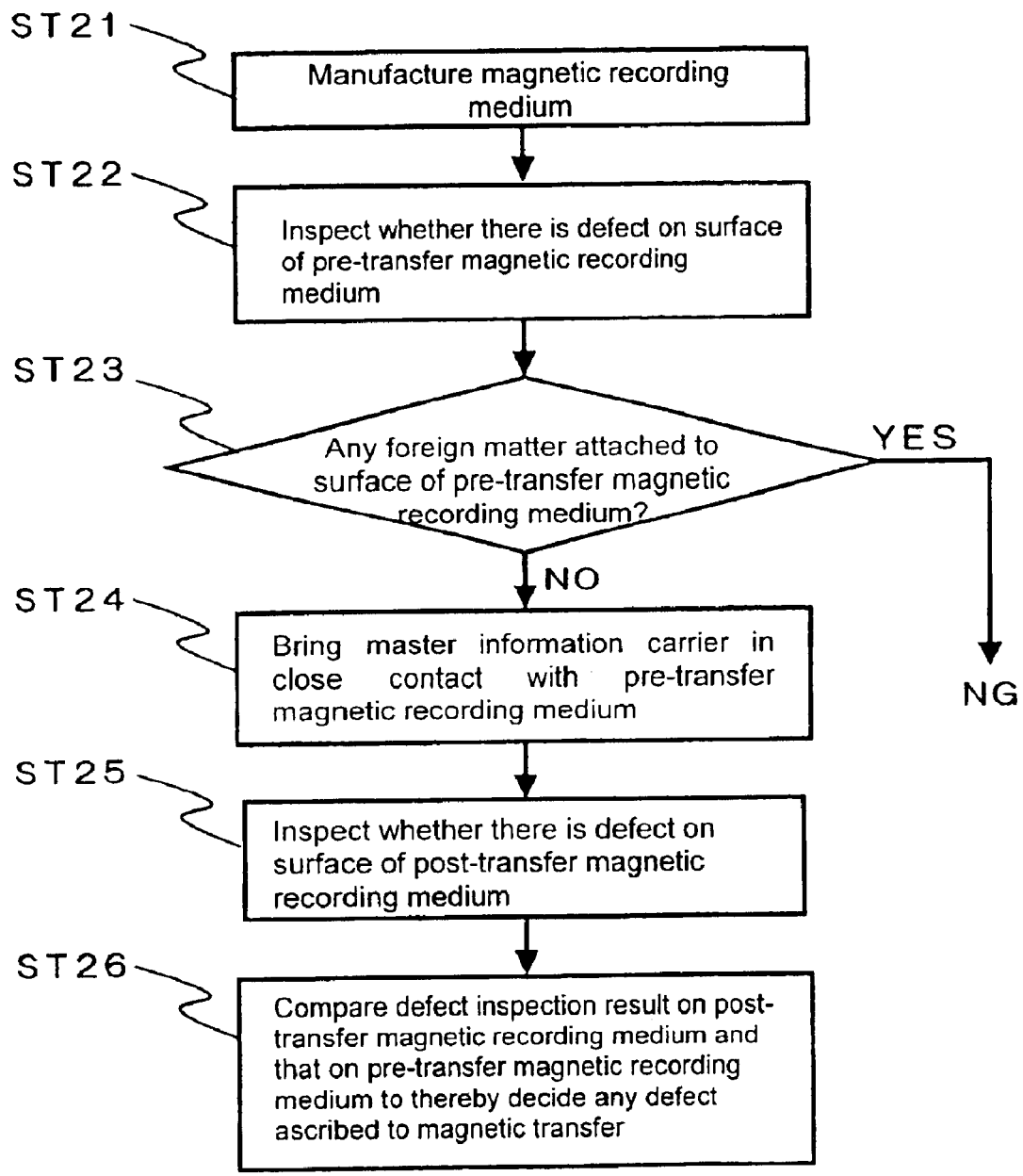
FIG. 26 is a flowchart for showing steps of manufacturing a magnetic recording medium in a third embodiment of the invention.

FIG. 26 is a flowchart for showing steps according to this embodiment. In FIG. 26, first a magnetic layer is formed by a publicly known method of manufacturing a magnetic recording medium at step ST21. Specifically, the magnetic layer is formed by, for example, dry plating such as evaporation or sputtering on an aluminum-made base plate. Also, ordinarily, such a method is employed as providing a protecting film on the magnetic layer to thereby protect it. The protecting film is formed by dry plating such as evaporation or sputtering, dipping, or spin coating.

The following will describe steps ST22 and ST25 for inspecting a defect on the surface of the magnetic recording medium. The steps of ST22 and ST25 are similar to the steps of ST1 and ST4 shown in FIG. 12 of the first embodiment respectively. That is, the inspection apparatus shown in FIG. 13 is employed.

At step ST22, the process inspect whether there is any defect possibly present on the pre-transfer magnetic recording medium 1 originally.

Next, at the step of ST23, the process inspects whether any foreign matter is present on the surface of the pre-transfer magnetic recording medium 1. Specifically, a publicly known optical defect inspection method is employed to check for foreign matter on the pre-transfer magnetic recording medium 1. According to this embodiment, an optical inspection apparatus which is different from but equivalent to that employed at ST22 was used to inspect whether there is foreign matter sized 1 $\mu$m or larger attached to the surface of the magnetic recording medium 1 by setting a foreign-matter detection slice level at 1 $\mu$m beforehand. If foreign matter sized 1 $\mu$m or larger was detected, the process decides the magnetic recording medium to be NG (rejectable) and, otherwise, to be OK (acceptable). If it is decided to be acceptable, the process goes to the next step of ST23. If it is decided to be rejectable, on the other hand, the process washes and recycles the magnetic recording medium. If it is decided to be rejectable even after being recycled, it is disposed.

It is thus possible to inspect whether there is foreign matter on the surface of the magnetic recording medium before it undergoes magnetic transferring at ST24 in order to prevent foreign matter, if any, on the surface of the pre-transfer magnetic recording medium 1 from being attached to the master information carrier 2 and damaging it.

Also, like at the step of ST22, at the step of ST23 also, in inspection the motor (not shown) for scanning the surface of the pre-transfer magnetic recording medium 1 in a spiral manner is returned to its home position with respect to a turned phase before and after inspection in order to avoid a large shift in turned phase of the pre-transfer magnetic recording medium when it is loaded or unloaded.

At ST24, the process brings the master information carrier 2 and the pre-transfer magnetic recording medium 1 as finished with defect inspection in close contact with each other to then transfer a pattern magnetically almost the same manner as described with reference to FIGS. 1 and 2. That is, the process performs the same processing except that the magnetic recording medium 1 referred to in FIGS. 1 and 2 is replaced by the pre-transfer magnetic recording medium 1.

Then, the process inspect for a defect possibly present on the surface of the post-transfer magnetic recording medium 1. That is, the process performs step ST25. At the step of ST25, specifically the process inspects whether a defect occurred on the magnetic recording medium 1 because the master information carrier 2 has been brought in close contact with the pre-transfer magnetic recording medium 1. By close contacting, a defect on the master information carrier 2 is transferred to the magnetic recording medium, thus providing the post-transfer magnetic recording medium.

Figure 27:
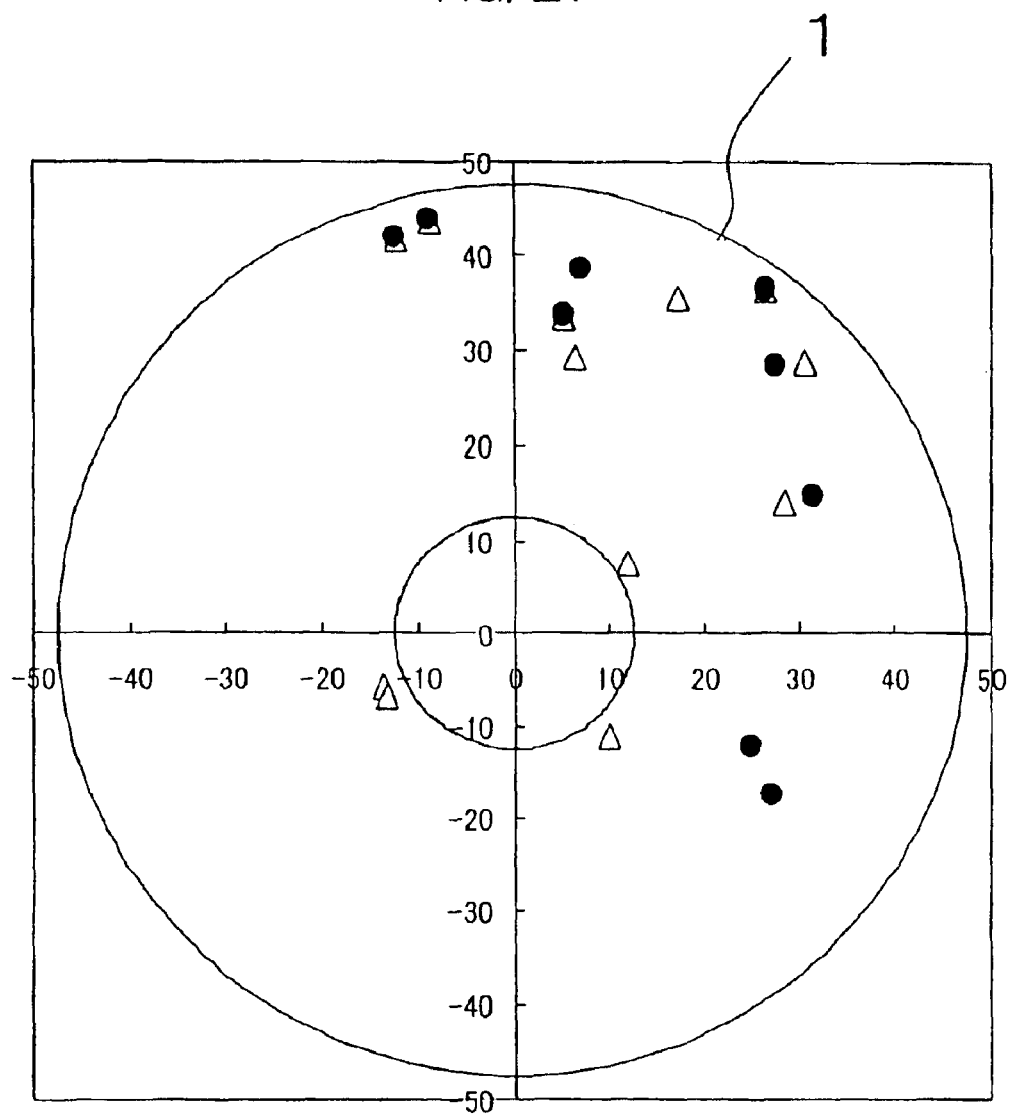
FIG. 27 is an illustration for showing a result of defect inspection performed at step ST22 in the third embodiment of the invention.
Figure 28:
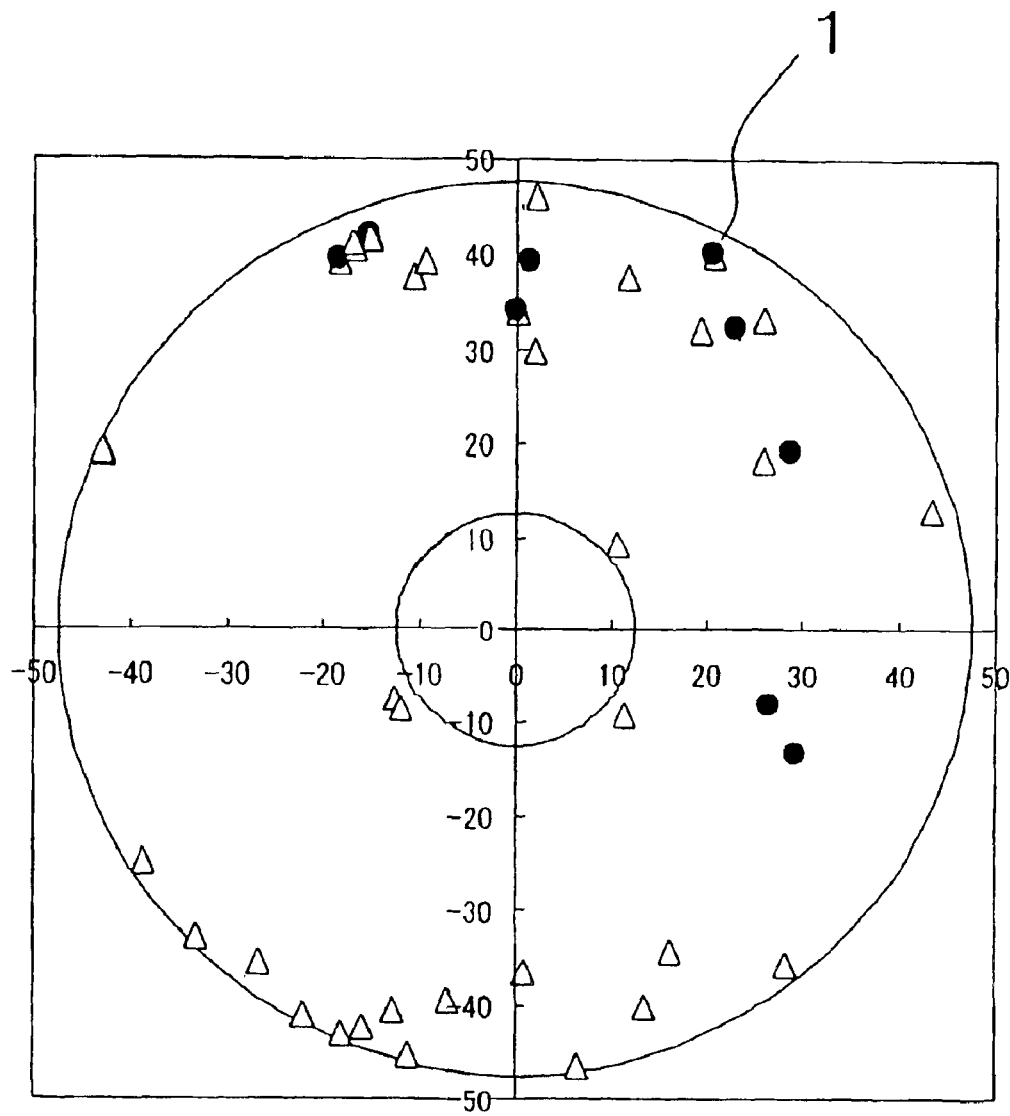
FIG. 28 is an illustration for showing a result of defect inspection performed at step ST25 in the third embodiment of the invention.

An example of a result of defect inspection performed at the step for inspecting a defect on the surface of the post-transfer magnetic recording medium is shown in FIGS. 27 and 28. FIG. 27 shows the result of defect inspection performed at step ST22 and FIG. 28 shows the result of defect inspection performed at step ST25, that is, the result of defect inspection on the post-magnetic transfer magnetic recording medium 1. In FIGS. 27 and 28, a solid circle (●) indicates a center position of a defect optically recognized by the photo-receptor element of the regularly-reflected light reception system 102 and a triangle (Δ) indicates that optically recognized by the photo-receptor element of the scattered-light reception system 103.

Next, at step ST26 of FIG. 26 for deciding a defect caused by magnetic transfer, the process performs almost the same as that described with reference to FIG. 16. "inspection substrate" in that description may be replaced by "magnetic recording medium".

FIG. 29 shows a result of comparing a defect inspection result obtained at ST22 and that obtained at step ST25 to each other to thereby enumerate defects with a turned phase shift amount of 10 degrees or less and a position shift amount of 0.5 mm or less of those detected by the regularly reflected light receptor element. FIG. 29 should be seen almost the same way as for FIG. 18. FIG. 29 shows that based on the defect inspection results obtained at the steps of ST22 and ST25 a turned phase shift of the magnetic recording medium as inspected for defects is decided to be 8.625 degrees. Based on thus obtained phase shift, phase correction is performed. The phase correction method is already described.

Figure 30:
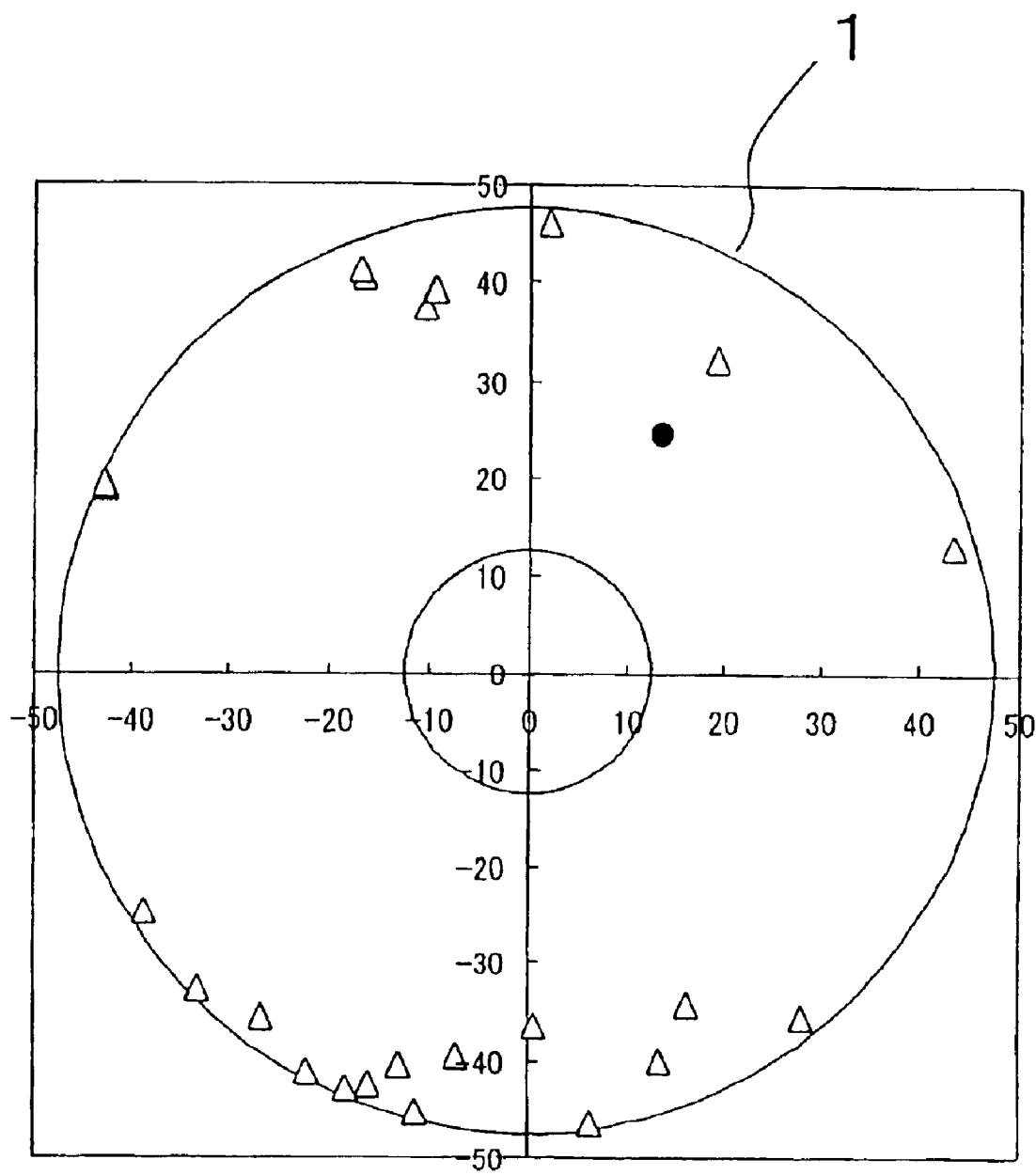
FIG. 30 is an illustration for showing a result of subtraction performed in the third embodiment of the invention.
Figure 31A:
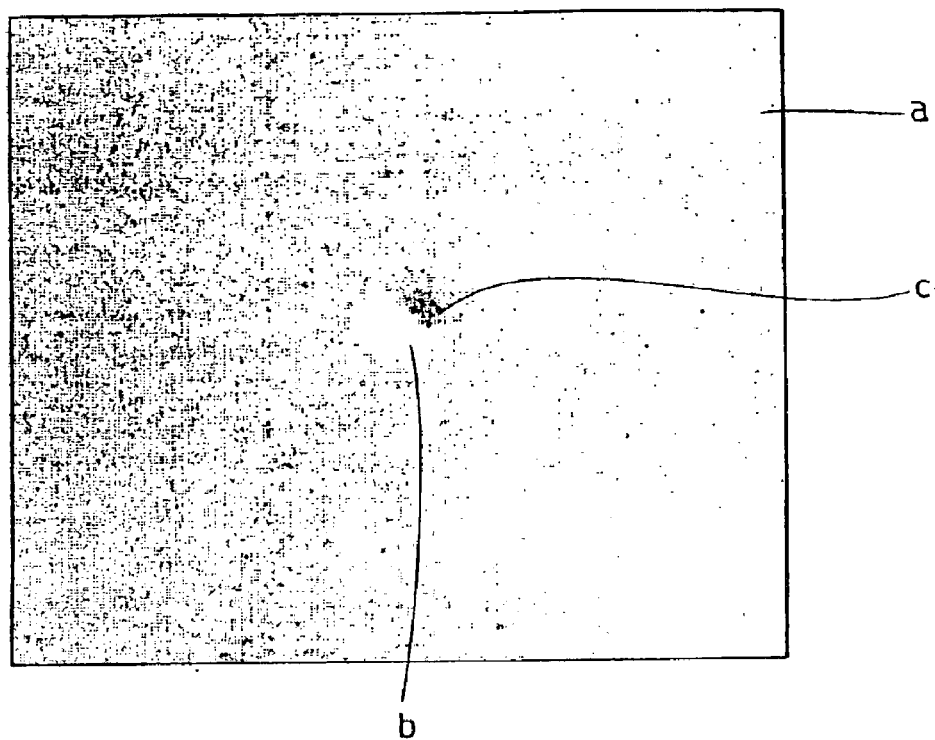
FIGS. 31 are illustrations for showing a result of observing a surface of a conventional recording medium after magnetic transfer.
Figure 31B:
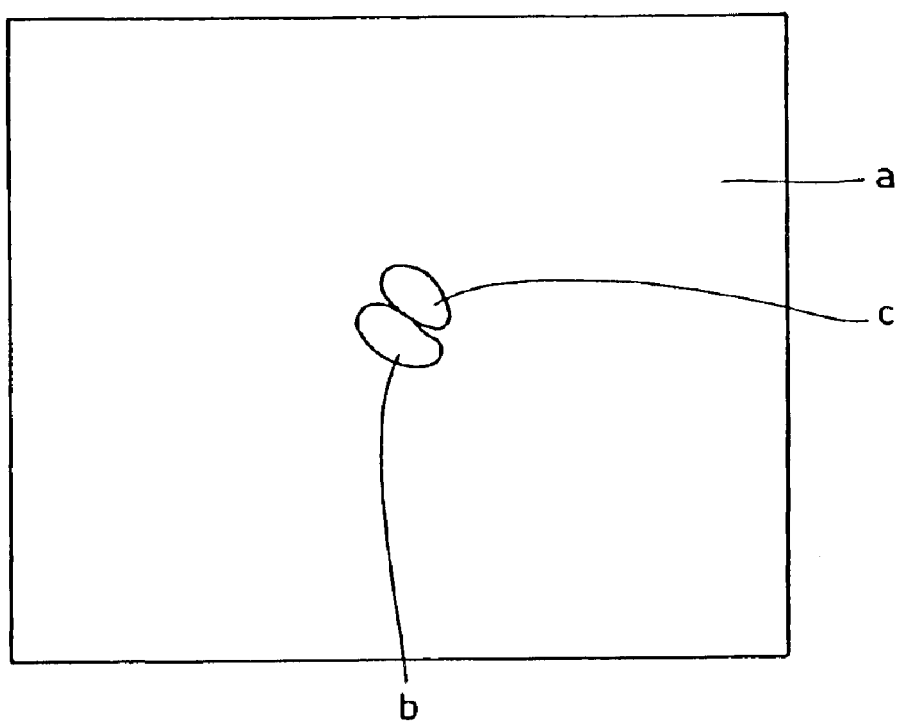
Figure 32:
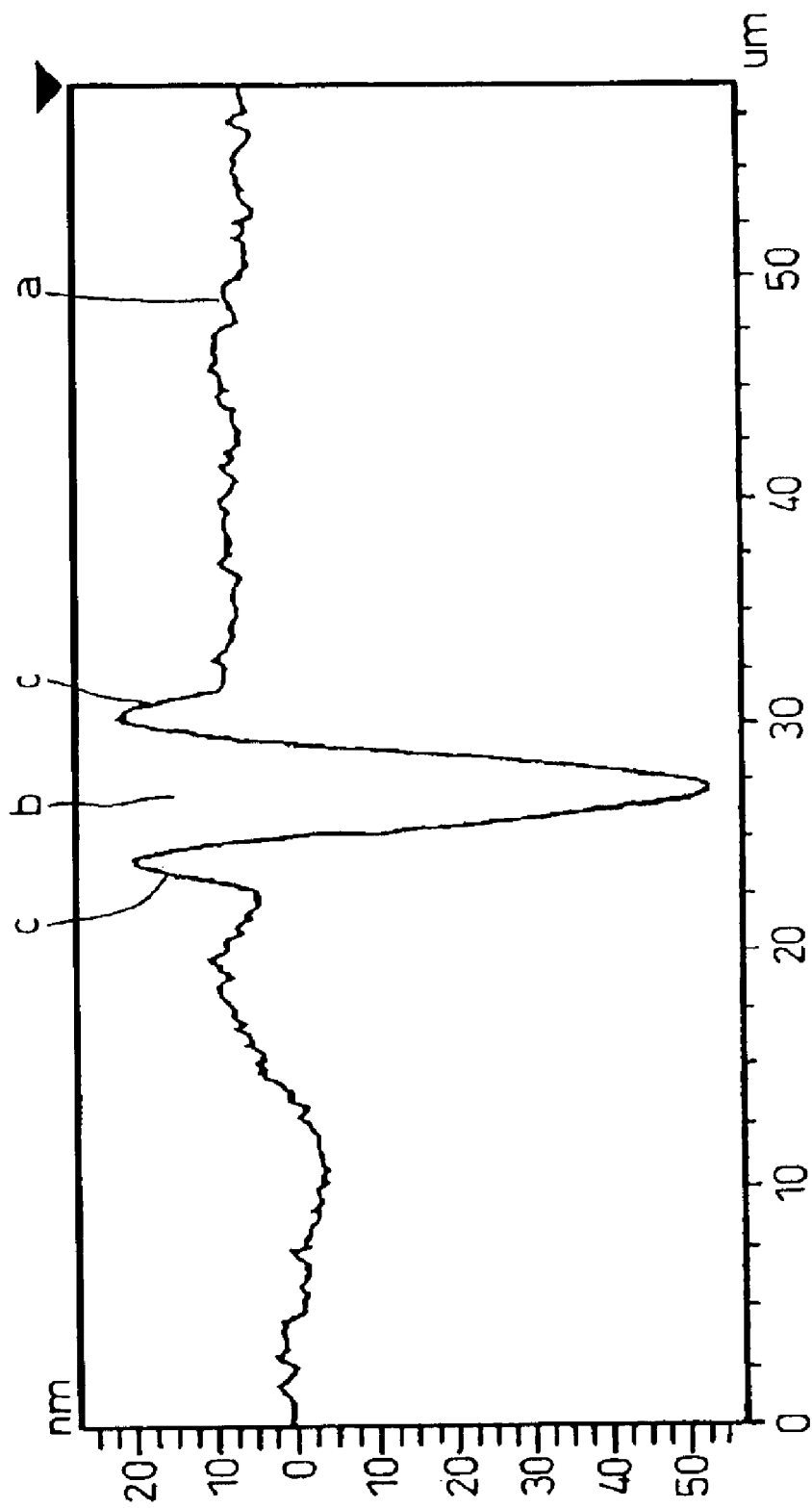
FIG. 32 is a graph for showing a pit in the conventional magnetic recording medium.
Figure 33:
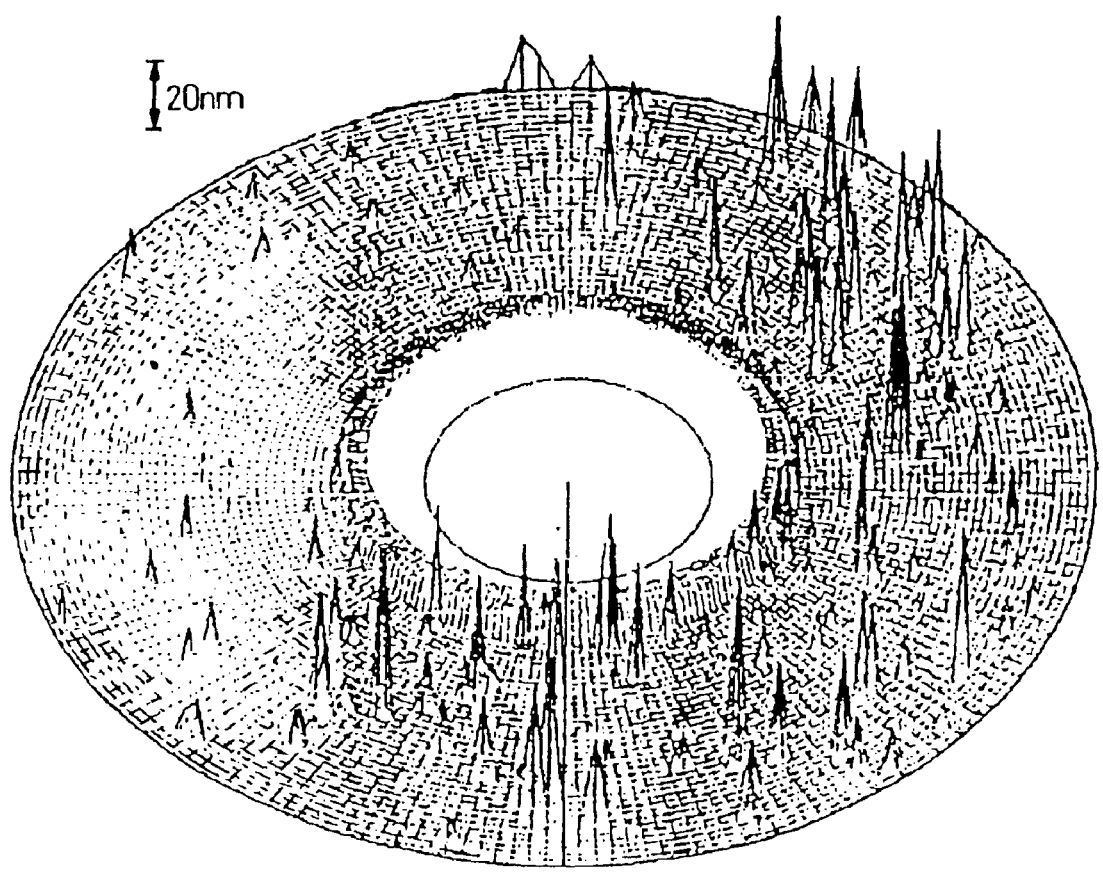
FIG. 33 is an illustration for showing a result of optically measuring a state of a protrusion on the surface of the magnetic recording medium after magnetic transfer is performed by a conventional magnetic transfer method.

FIG. 30 shows a result of subtraction performed in the same manner as at ST14. The result of FIG. 30 shows that there are one defect detected by the photo-receptor element of the regularly-reflected light reception system 102 and 24 defects detected by that of the scattered light reception system 103. As a result of observation on the defects by use of a microscope, it was confirmed that the detect detected by the photo-receptor element of the regularly-reflected light reception system 102 is a pit such as shown in FIG. 31 and the defects detected by the photo-receptor element of the scattered light reception system 103 are a minute particle.

By employing the above-mentioned method, it is possible to detect, accurately and at a high sensitivity, defects produced on the surface of the magnetic recording medium by magnetic transfer of those present thereon.

According to this method, it is possible to surely detect a defect produced on the magnetic recording medium by magnetic transfer, thus providing a magnetic recording/reproducing apparatus with a high reliability.

As detailed above, the invention provides indirect inspection for inspecting a defect on the master information carrier that is difficult to identify because of a magnetic film pattern that corresponds to the information signal. A the same time, the invention overcomes problems newly derived from indirect inspection. The invention can give such an idiosyncratic and subtle method, to highly accurately inspect a defect on the master information carrier, which originally finds it difficult to identify defects owing to the magnetic film pattern.

Also, the invention makes it possible to highly accurately detect a defect caused by magnetic transfer by surely detecting a minute defect caused by magnetic transfer in defect inspection on a magnetic recording medium. This leads to the implementation of a magnetic recording/reproducing apparatus with a high reliability.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A defect inspection method for a master information carrier having a magnetic film pattern that corresponds to an information signal to be magnetically transferred to a magnetic recording medium, comprising the steps of:

inspecting a defect possibly present originally on a first-state inspection substrate to which a defect on the master information carrier is to be transferred;

bringing the master information carrier in close contact with the first-state inspection substrate finished with defect inspection to thereby transfer the defect possibly present on the master information carrier to the inspection substrate finished with defect inspection;

inspecting a defect, if any, on the second-state inspection substrate to which the defect is already transferred and also which is separated from the master information carrier; and comparing a defect inspection result on said second-state inspection substrate and a defect inspection result on said first-state inspection substrate to each other to thereby decide the defect possibly present on said master information carrier.

2. The defect inspection method for the master information carrier according to claim 1, comprising between said step of defect inspection on said first-state inspection substrate and said close-contacting step a step for inspecting whether the number or size of the defects detected by defect inspection on said first-state inspection substrate is not larger than a predetermined value and, if said predetermined value is exceeded, stopping on-going processing and, otherwise, going to said close-contacting step.

3. The defect inspection method for the master information carrier according to claim 1, wherein:

said defect inspection step for said first-state inspection substrate involves counting the defects present on said first-state inspection substrate;

said defect inspection step for said second-state inspection substrate involves counting the defects present on said second-state inspection substrate; and said defect decision step for said master information carrier through comparison involves deciding whether a count of the defects on said first-state inspection substrate and a count of the defects on said second-state inspection substrate are the same as each other and, if they are the same as each other, deciding that said master information carrier has no defect thereon and, otherwise, deciding that said master information carrier has one.

4. The defect inspection method for the master information carrier according to claim 1, wherein:

said defect inspection step for said first-state inspection substrate involves extracting position information of the defect present on said first-state inspection substrate;

said defect inspection step for said second-state inspection substrate involves extracting the position information of the defect present on said second-state inspection substrate; and said defect decision step for said master information carrier through comparison involves deciding whether the position information of the defect on said first-state inspection substrate and the position information of the defect on said second-state inspection substrate are the same as each other and, if they are the same as each other, deciding that said master information carrier has no defect thereon and, otherwise, deciding that said master information carrier has one.

5. The defect inspection method for the master information carrier according to claim 4, wherein when the defects are decided consecutively over a plurality of minute unit regions of those obtained by partitioning the whole region of said inspection substrate, said plurality of consecutive unit regions is regarded as one apparent region to obtain the position information of one defect supposed to be located at or near the gravity center of said apparent region.

6. The defect inspection method for the master information carrier according to claim 1, wherein taking into account a surface-directional position shift that occurs at time of close contacting with said master information carrier, as said inspection substrate, one such is employed as to have at least a size corresponding to a maximum region of the surface-directional position shift thereof.

7. The defect inspection method for the master information carrier according to claim 1, wherein as said inspection substrate, one such is used as to have almost the same size as said magnetic recording medium and also, taking into account a surface-directional position shift when said master information carrier and said inspection substrate are brought in close contact with each other, said master information carrier and said inspection substrate are brought in close contact with each other a plurality of times at different close-contacting positions so that said inspection substrate having almost the same size as that of said magnetic recording medium may come in close contact with an overall maximum region of said surface-directional position shift in said master information carrier.

8. The defect inspection method for the master information carrier according to claim 1, wherein as said inspection substrate, one such is used as to be made of a main component that is a constituent component of said magnetic recording medium.

9. The defect inspection method for the master information carrier according to claim 1, wherein as said inspection substrate, one such is used as to have higher hardness than said master information carrier.

10. The defect inspection method for the master information carrier according to claim 1, wherein as said inspection substrate, one such is used as to be exempted from lubricant application on said magnetic recording medium.

11. The defect inspection method for the master information carrier according to claim 1, wherein as said inspection substrate, one such is used as to be magnetized on a close-contacting side surface thereof.

12. The defect inspection method for the master information carrier according to claim 1, wherein said master information carrier decided to be an acceptable article through defect inspection by use of said defect inspection method is utilized to thereby magnetically transfer said defect in the form of an information signal to said magnetic recording medium based on said magnetic film pattern on said master information carrier, and wherein when a side surface of said master information carrier on which said magnetic film pattern is formed is brought in close contact with said magnetic recording medium, an external magnetic field is applied to thereby magnetically transfer to said magnetic recording medium said information signal based on said magnetic film pattern of said master information carrier.

13. The defect inspection method for the master information carrier according to claim 1, wherein said master information carrier decided to be an acceptable article through defect inspection by use of said defect inspection method is utilized to thereby magnetically transfer said defect in the form of an information signal to said magnetic recording medium based on said magnetic film pattern on said master information carrier, and wherein said magnetic film pattern of said master information carrier is magnetized beforehand, so that the side surface of said master information carrier on which said magnetic film pattern already magnetized is formed is brought in close contact with said magnetic recording medium, thus magnetically transferring to said magnetic recording medium said information signal based on said magnetic film pattern of said master information carrier.

14. A magnetic recording/reproducing apparatus comprising said magnetic recording medium to which an information signal is magnetically transferred by a method of magnetically transferring said magnetic film pattern of said master information carrier, and a magnetic head for performing recording/reproduction on said magnetic recording medium, wherein said master information carrier as decided to be free of defect by defect inspection method according to claim 1 and said magnetic recording medium as decided to be free of defect by said magnetic transfer method for said magnetic film pattern of said master information carrier are used in recording or reproduction.

15. A defect inspection method for a master information carrier having a magnetic film pattern that corresponds to an information signal to be magnetically transferred to a magnetic recording medium, comprising the step of:

inspecting a defect possibly present originally on a first-state inspection substrate to which a defect on said master information carrier is to be transferred and also measuring, previously or afterward, a turned phase of said first-state inspection substrate with respect to defect inspection means;

bringing said master information carrier in close contact with said first-state inspection substrate finished with defect inspection to then transfer the defect possibly present on said master information carrier to said inspection substrate finished with defect inspection;

inspecting the defect on said second-state inspection substrate to which the defect is already transferred to and which is separated from said master information carrier and also, previously or afterward, measuring the turned phase of said second-state inspection substrate with respect to the defect inspection means;

correcting a phase shift based on said measured two turned phases; and comparing a defect inspection result on said second-state inspection substrate and a defect inspection result on said first-state inspection substrate to each other to thereby decide the defect possibly present on said master information carrier.

16. The defect inspection method for the master information carrier according to claim 15, wherein at said turned phase correction step the turned phase of the defect detected on the basis of detected light regularly reflected by said inspection substrate when light is applied to said inspection substrate is corrected.

17. The defect inspection method for the master information carrier according to claim 15, wherein at said turned phase correction step the turned phase of the defect detected on the basis of detected light scattered by said inspection substrate when light is applied to said inspection substrate is corrected.

18. The defect inspection method for the master information carrier according to claim 15, wherein at said turned phase correction step the turned phase of the defect detected on the basis of detected light regularly reflected or scattered by said inspection substrate when light is applied to said inspection substrate is corrected and, at the same time, giving priority on turned phase correction based on said regularly reflected light detected.

19. A defect inspection method for a magnetic recording medium, comprising the steps of:

inspecting a defect possibly present originally on a pre-transfer magnetic recording medium;

bringing a master information carrier in close contact with said pre-transfer magnetic recording medium finished with defect inspection to thereby magnetically transfer an information signal based on a magnetic film pattern of said master information carrier to said pre-transfer magnetic recording medium finished with defect inspection;

inspecting a defect on said post-transfer magnetic recording medium as separated from said master information carrier; and comparing a defect inspection result on said post-transfer magnetic recording medium and a defect inspection result on said pre-transfer magnetic recording medium to each other to thereby decide such a defect on said magnetic recording medium as to be caused by said transfer step.

20. The defect inspection method for the magnetic recording medium according to claim 19, further comprising between said step of defect inspection on said pre-transfer magnetic recording medium and said close-contacting step a step for inspecting whether the number or size of the defects detected through defect inspection on said pre-transfer magnetic recording medium is not larger than a predetermined value and, if said predetermined value is exceeded, stopping on-going processing and, otherwise, going to said close-contacting step.

21. The defect inspection method for the magnetic recording medium according to claim 19, wherein:

in said step of defect detection on said pre-transfer magnetic recording medium, the defects on said pre-transfer magnetic recording medium are counted;

in said step of defect inspection on said post-transfer magnetic recording medium, the defects on said post-transfer magnetic recording medium are counted; and in said step of defect decision through comparison on said magnetic recording medium, it is decides whether the count of the defects on said pre-transfer magnetic recording medium and the count of the defects on said post-transfer magnetic recording medium are the same and, if they are the same as each other, it is decided that said magnetic recording medium has no defect and, otherwise, that said magnetic recording medium has one.

22. The defect inspection method for the magnetic recording medium according to claim 19, wherein:

in said step of defect inspection on said pre-transfer magnetic recording medium, position information of the defect on said pre-transfer magnetic recording medium;

in said step of defect inspection on said post-transfer magnetic recording medium, position information of the defect on said post-transfer magnetic recording medium; and in said step of defect decision on said magnetic recording medium through comparison, it is decided whether the position information of the defect on said pre-transfer magnetic recording medium and the position information of the defect on said post-transfer magnetic recording medium are the same as each other and, they are the same, it is decided that said magnetic recording medium has no defect thereon and, otherwise, that said magnetic recording medium has one.

23. The defect inspection method for the magnetic recording medium according to claim 22, wherein when the defects are decided consecutively over a plurality of minute unit regions of those obtained by partitioning a whole region of said magnetic recording medium, said plurality of consecutive unit regions is regarded as one apparent region to obtain the position information of one defect supposed to be located at or near a gravity center of said apparent region.

24. A defect inspection method for a magnetic recording medium, comprising the steps of:

inspecting a defect possibly present on a pre-transfer magnetic recording medium originally and also, previously or afterward, measuring a turned phase of said pre-transfer magnetic recording medium with respect to defect inspection means;

bringing a master information carrier in close contact with said pre-transfer magnetic recording medium finished with defect inspection to then magnetically transfer an information signal based on a magnetic film pattern of said master information carrier to said pre-transfer magnetic recording medium finished with defect inspection;

inspecting a defect on said post-transfer magnetic recording medium as separated from said master information carrier and also, previously or afterward, measuring a turned phase of said post-transfer magnetic recording medium with respect to said defect inspection means;

correcting a shift in phase based on said two measured turned phases; and comparing a defect inspection result on said post-transfer magnetic recording medium and a defect inspection result on said pre-transfer magnetic recording medium to each other to thereby decide a defect produced on said magnetic recording medium by said transfer step.

25. The defect inspection method for the magnetic recording medium according to claim 24, wherein at said turned phase correction step the turned phase of the defect detected on the basis of detected light regularly reflected by said magnetic recording medium when light is applied to said magnetic recording medium is corrected.

26. The defect inspection method for the magnetic recording medium according to claim 24, wherein at said turned phase correction step the turned phase of the defect detected on the basis of detected light scattered by said magnetic recording medium when light is applied to said magnetic recording medium.

27. The defect inspection method for the magnetic recording medium according to claim 24, wherein at said turned phase correction step the turned phase of the defect detected on the basis of detected light regularly reflected or scattered by said magnetic recording medium when light is applied to said magnetic recording medium is corrected and, at the same time, priority is given to the turned-phase correction based on said regularly reflected light detected.

* * * * *